United States Patent [19]

Sanjyou et al.

[11] Patent Number: 5,616,423
[45] Date of Patent: Apr. 1, 1997

[54] CERAMIC SUBSTRATE HAVING A MULTILAYERED METALLIC THIN FILM

[75] Inventors: Akira Sanjyou, Nara pref.; Yasuo Nakatsuka; Yasuyuki Morita, both of Hyogo pref.; Koichi Uno, Aichi pref., all of Japan

[73] Assignee: Sumitomo Metal Industries, Ltd., Osaka, Japan

[21] Appl. No.: 267,892

[22] Filed: Jul. 6, 1994

[30] Foreign Application Priority Data

May 19, 1994 [JP] Japan ................................. 6-105570

[51] Int. Cl.$^6$ ................................................ B32B 15/04
[52] U.S. Cl. .................. 428/632; 428/635; 428/660; 428/665; 428/666; 428/667; 428/663; 428/680; 428/675; 428/671
[58] Field of Search ............................ 428/635, 660, 428/632, 663, 664, 674, 661, 665, 666, 667, 672, 673, 675, 680, 671, 627, 469, 472; 257/761, 762, 763, 767

[56] References Cited

U.S. PATENT DOCUMENTS

| | | | |
|---|---|---|---|
| 3,814,633 | 6/1974 | Freedman et al. | 257/763 |
| 4,290,079 | 9/1981 | Carpenter et al. | 257/762 |
| 4,532,190 | 7/1985 | Kanbe et al. | 428/632 |
| 4,702,967 | 10/1987 | Black et al. | 428/673 |
| 4,904,452 | 2/1990 | Mroczkowski | 428/635 |
| 5,155,340 | 10/1992 | Morita et al. | 219/543 |

FOREIGN PATENT DOCUMENTS

| | | | |
|---|---|---|---|
| 0279588 | 8/1988 | European Pat. Off. | 257/763 |
| 3-241859 | 10/1991 | Japan | 428/674 |

OTHER PUBLICATIONS

Holusha, "Layer by Layer to the Perfect Blend of Metals", The New York Times, Dec. 1991, p. F9.

*Primary Examiner*—Ngoc-Yen Nguyen
*Attorney, Agent, or Firm*—Armstrong, Westerman, Hattori, McLeland & Naughton

[57] ABSTRACT

A ceramic substrate has a five-layered thin metallic film thereon. The first layer is Ti, Zr, Cr and/or W; the second layer is Ni and/or Mo; the third layer is one or more metals of group Ib in the periodic table; the fourth layer contains the same metals as the second layer and the fifth layer contains the same metals as the third layer.

2 Claims, 11 Drawing Sheets

(a)

(b)

(c)

CERAMIC SUBSTRATE HAVING A MULTILAYERED METALLIC THIN FILM

BACKGROUND OF THE INVENTION

1. Field of the Invention

The present invention relates to a ceramic substrate having a multilayered metallic thin film and to a method for producing the same. More particularly, it relates to a ceramic substrate having a multilayered metallic thin film, which is solid and excellent in film adhesion strength, even against thermal shock, and on which a fine circuit interconnection can be formed.

2. Description of the Relevant Art

Ceramics are materials for parts, excellent in heat resistance and thermal shock resistance, having a high breaking strength and used in various ways. In the semiconductor industry, they are used in an IC package or the like when used in an IC package, a fine circuit interconnection is formed with a metallic thin film on a ceramic substrate and a lead frame is connected thereto. In many cases, the ceramics are used after being chemically treated, and it is necessary that the ceramics and metals be tightly connected.

Generally, a ceramic package is produced by the steps of printing an interconnection on green sheets formed from an oxide powder or other raw material for preparing ceramics, and then laminating and co-sintering the printed green sheets. However, methods for forming an interconnection circuit of the outermost layer of a ceramic package and materials used for the interconnection vary widely depending on the methods of mounting.

In the case of wire bonding, the most generally used mounting method, the intervals between the wore bonding formed on the outermost layer of the ceramic package are about a few hundred μm. Since the wire bonding pads are sintered after printing, essentially no problem is caused even if the wire bonding pads shrink. By the above co-sintering method using tungsten or the like as the interconnection material, bonding pads and a circuit interconnection in a ceramic package can be formed.

In the tape automated bonding (TAB) or flip chip bonding method for mounting an LSI of higher density, the intervals between bonding pads for connecting LSI are very small, around 50 μm, and dimensional accuracy of less than 0.3% is required. Consequently, it is difficult to form bonding pads for connects on the outermost layer in the TAB or flip chip bonding method by the co-sintering method.

When forming bonding pads on the outermost layer of ceramic package for the TAB or flip chip bonding method, thick film printing method or thin film method has been used.

The thick film printing method comprises the steps of printing conductor paste wherein conductor grains are dispersed in organic vehicle through a mesh screen on a ceramic substrate, forming an interconnection pattern by chemical etching, sintering the grains onto the ceramic substrate by heating in a reductive atmosphere and metallizing the surface of the ceramic. The thick film method is excellent due to its ease in forming an interconnection layer, but has the problem of being difficult to use when forming a highly precise fine interconnection pattern.

The thin film method comprises the steps of evaporating a metallic thin film on a ceramic substrate by a physical vapor deposition method, for example by sputtering heating in a vacuum vessel or inert gas atmosphere and forming an interconnection pattern by photolithography. The metallic thin film generally consists of plural thin films.

One example of forming a multilayered thin film by sputtering is described below. Generally, a target comprising the same metal as constitutes the thin film is set on the cathode in a vacuum apparatus, while the ceramic substrate on which a thin film is formed is set on the anode. Next, after evacuating the system to a high vacuum, argon gas for sputtering the target is introduced, a high frequency is applied between the cathode and anode, and a metallic thin film is accumulated on the ceramic substrate. Several kinds of thin films are laminated by repeating the above operation using different targets.

The thin film method is inferior to the thick film printing method because it requires forming metallic thin films on a substrate using a high vacuum by a physical vapor deposition method. However, it has many advantages as follows: (1) it is easy to control film thickness; (2) each kind of metallic thin film can be formed successively; (3) the pattern exchange difference between the photomask and the interconnection pattern on a substrate can be held down to less than several μm even in forming an interconnection pattern by photolithography; and (4) there are few interruptions in the interconnection pattern. Hence, it is the most suitable method for forming a highly precise fine interconnection pattern.

A diagrammatic sectional view of a ceramic substrate having a multilayered metallic thin film conventionally used for an IC package or the like is shown in FIG. 14. In the figure, reference numeral 12 represents a ceramic substrate, and the first metallic thin film layer 230 comprising Ti or the like is formed by the above method on the surface of the ceramic substrate 12. The second metallic thin film layer 240 comprising Mo, Ni or the like, on the first metallic thin film layer 230, and the third metallic thin film layer 260 comprising Ag, Cu or the like, on the second metallic thin film layer 240, are formed respectively by a chemical or physical vapor deposition method. And as the outermost layer, a coating layer 260 of Cu is formed by electroplating. The first metallic thin film layer 230 the second metallic thin film layer 240, the third metallic thin film layer 250 and the coating layer 260 constitute a multilayered metallic thin film 270, which constitutes a ceramic substrate having a multilayered, metallic thin film 210 with the ceramic substrate 12. Here, the ceramic substrate 12 can be a multilayered interconnecting substrate inside which a multilayered interconnection is formed.

In the ceramic substrate having a multilayered metallic thin film 210, the first metallic thin film layer 230 functions as bonding layer to the ceramic substrate 12, the second metallic thin film layer 250 functions as a barrier layer for preventing the metallic elements constituting the first metallic thin film layer 230 from diffusing upward, and the third metallic thin film layer 250 functions as a base layer for plating.

A problem in forming a fine interconnection pattern on the outermost layer of the ceramic substrate 12 by a physical vapor deposition method, such as the sputtering method described above, is adhesion between the multilayered thin film 270 on the ceramic substrate 12.

FIG. 15 is a diagrammatic enlarged sectional view showing the outer layer of the ceramic substrate 12 when a metallic thin film is formed on the surface thereof by a physical vapor deposition method. In the figure, reference numeral 71 represents the ceramic substrate surface. Generally, the ceramic substrate surface 71 comprises an aggregated body of sintered particles 72 in microscopic view, with appreciable unevenness and basin-shaped holes or pores 73 thereon. In forming the metallic thin film 74 by a physical vapor deposition method using a high vacuum of $10^{-3}$–$10^6$ Torr, the mean free path of evaporating atoms or molecules in the vacuum becomes relatively long. Thus, it becomes difficult to form the metallic thin film 74 inside pores 73, and the metallic thin film 74 is mainly formed on the convex section of the ceramic substrate surface 71 making it difficult to homogeneously coat the ceramic substrate surface 71.

Using a physical vapor deposition method, the metallic thin film 74 is not formed on some parts of the ceramic substrate surface 71, and even in the case of forming a coating after formation of the metallic thin film 74 by a physical vapor deposition method, the coating is not formed on some parts of the ceramic substrate surface 71. As a result, the whole metallic thin film 74, including the coating, can peel from the ceramic substrate surface 71.

When LSI elements are mounted on a TAB, wherein a Cu interconnection pattern 35 μm thick is formed, it is required that the Cu interconnection in the TAB should have a film adhesion strength of more than 2 kg/mm$_2$. It is also required that the ceramic substrate having a multilayered metallic thin film 210 have a similar film adhesion strength. Taking into consideration reproductivity and reliability depending on changes or conditions in the thin film formation, a much higher film adhesion strength is desired. And it is also required that the adhesion strength of the thin film should not be deteriorated by thermal shock.

Conventional ceramic substrate having a multilayered metallic thin film 210 with the above structure have insufficient film adhesion strength. Few of the substrates have a film adhesion strength or more than 2 kg/mm$_2$ in a peel test and are stable to thermal shock.

In order to use the ceramic substrate having a multilayered metallic thin film 210 as a package for LSI, pins for the package are brazed onto the film. Since the temperature of the brazing is generally high, 800–900° C., the first metallic thin film layer (Ti layer) 230 formed on the ceramic substrate 12 diffuses into the upper layers, and in some cases, even reaches the outermost coating layer 260 of the multilayered metallic thin film 270.

The film thickness of the first metallic thin film titanium layer 230 is usually 0.1–0.2 μ at most. When the titanium 230 diffuses into the upper layers, the thickness of the first thin film is reduced, and it fails to function as a bonding layer to the ceramic substrate 12, lowering the adhesion between the multilayered metallic thin film 270 and the ceramic substrate 12.

And when the metal of the first metallic thin film layer 230 passes through the second metallic thin film layer 240, which should play a role of barrier layer, and diffuses to the surface of the third metallic thin film layer 250, which turns black, the film adhesion strength of the coating layer 260 formed by electroplating also becomes lowered.

In addition, the diffusion of titanium to the surface makes the connection between the coating film, formed in the plating step subsequent to brazing, and the multilayered metallic thin film 270 of the base weak, and the coating layer newly formed easy to peel.

SUMMARY OF THE INVENTION

The present invention was developed in order to solve problems, and it is an object of the present invention to provide a method for producing a ceramic substrate having a multilayered metallic thin film, wherein a metallic thin film having a high film adhesion strength to a ceramic substrate can be formed by improving the coating property of the metallic thin film onto the ceramic substrate.

It is another object of the invention to provide a ceramic substrate having a multilayered metallic thin film, wherein a metallic element constituting the first metallic thin film layer is prevented from diffusing into the upper layers, and which is stable and has a high film adhesion strength of more than 2 kg/mm$^2$ and excellent thermal shock resistance.

It is still another object of the invention to provide a ceramic substrate having a multilayered metallic thin film, wherein the metallic element constituting the first metallic thin film layer is prevented from diffusing into the layers even at a temperature at which pins are brazed thereto, and which has excellent adhesion to the coating formed in the plating step after brazing.

The present invention is described by reference to FIGS. 1–15.

Figure 1:
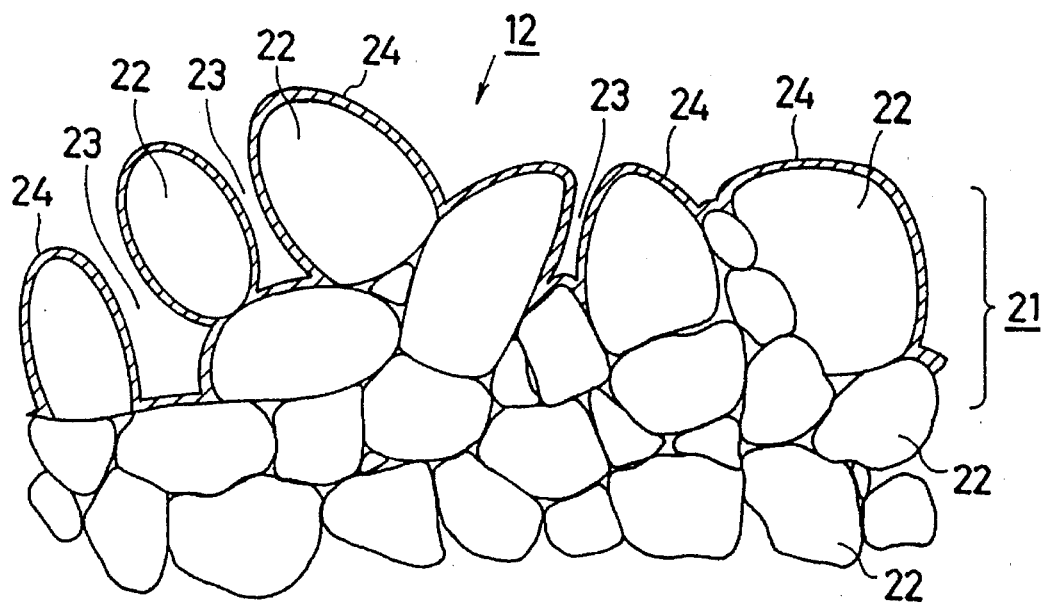
FIG. 1 is a diagrammatic enlarged sectional view showing the section of the ceramic substrate when a metallic thin film was formed on its surface by a chemical vapor deposition method.

FIG. 1 is a diagrammatical enlarged sectional view showing the state of the outer layer section of the ceramic substrate 12 when a metallic thin film was formed on its surface 21 by a chemical vapor deposition (CVD) method. In the case of forming a metallic thin film 24 by a chemical vapor deposition method, it is usual to set a vacuum of several Torr in the apparatus. The value is $10^{-3}$–$10^{-6}$ times larger than in the case of forming that film by a physical vapor deposition method, making the mean free path of the molecules, atoms, radical, etc. introduced into the apparatus shorter. As a result, the molecules, etc. enter the substrate 12 relatively easily, and adhesion of the metallic thin film 24 formed by the chemical vapor deposition method becomes high. And when plural metallic thin film layers are formed, the film adhesion strength of the whole multilayered metallic thin film to the ceramic substrate 12 becomes high.

Chemical vapor deposition methods useful in practicing the present invention are a plasma CVD method, in which direct current electricity, radio frequency microwave, both microwave and magnetic field, electron cyclotron resonance or the like is used; a thermal CVD method in which a compound is pyrolyzed in the vapor-phase or each raw material is allowed to react during heating and deposit on a substrate; and a reactive sputtering or reactive evaporation method in which sputtering or vacuum evaporation is conducted with supplying reactive gases. Methods for forming a metallic thin film by the PE-CVD method and by the ECR-CVD method are described in detail below.

Figure 2:
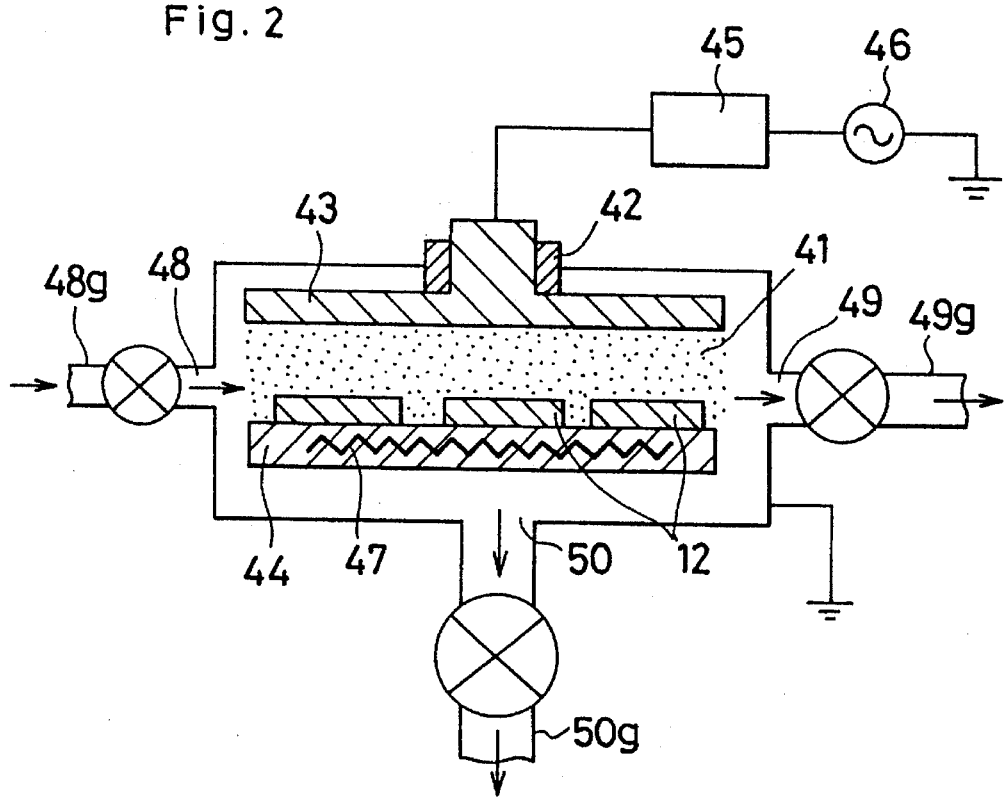
FIG. 2 is a diagrammatic sectional view showing an example of apparatus used for PE-CVD method.

FIG. 2 is a diagrammatic sectional view showing an example of apparatus sued for the PE-CVD method, where reference numeral 41 designates a plasma reaction chamber. RF electrode 43 is located on the upper was of the plasma reaction chamber 41, and is separated from the chamber by insulator 42. Sample stage 44, on which ceramic substrate 12 is placed, is arranged opposite to the RF electrode 43. RF generation source 46 is connected through the intermediary of matching box 45 to the RF electrode 43, and a heater 47 is buried in the sample stage 44. A reactive gas inlet 48 is formed on one side wall of the plasma reaction chamber.

After the ceramic substrate 12 is placed on the sample stage 44 in the plasma reaction chamber 41, the plasma reaction chamber 41 is evacuated to about 10 Tort using the main exhaust system 50g. Then, while evacuating through the reactive gas exhaust system 49g, a gas containing metallic atoms, is supplied in order that the desired gas pressure can be obtained. A plasma is generated by applied RF electricity, 13.56 MHz, for example, to the RF electrode 43 from the RF generation source 46.

In order to form a more dense metallic thin film excellent in adhesion, it is preferable to form the thin film by heating the ceramic substrate 12 to about 300° C. using the heater 47 buried in the sample stage 44.

Figure 3:
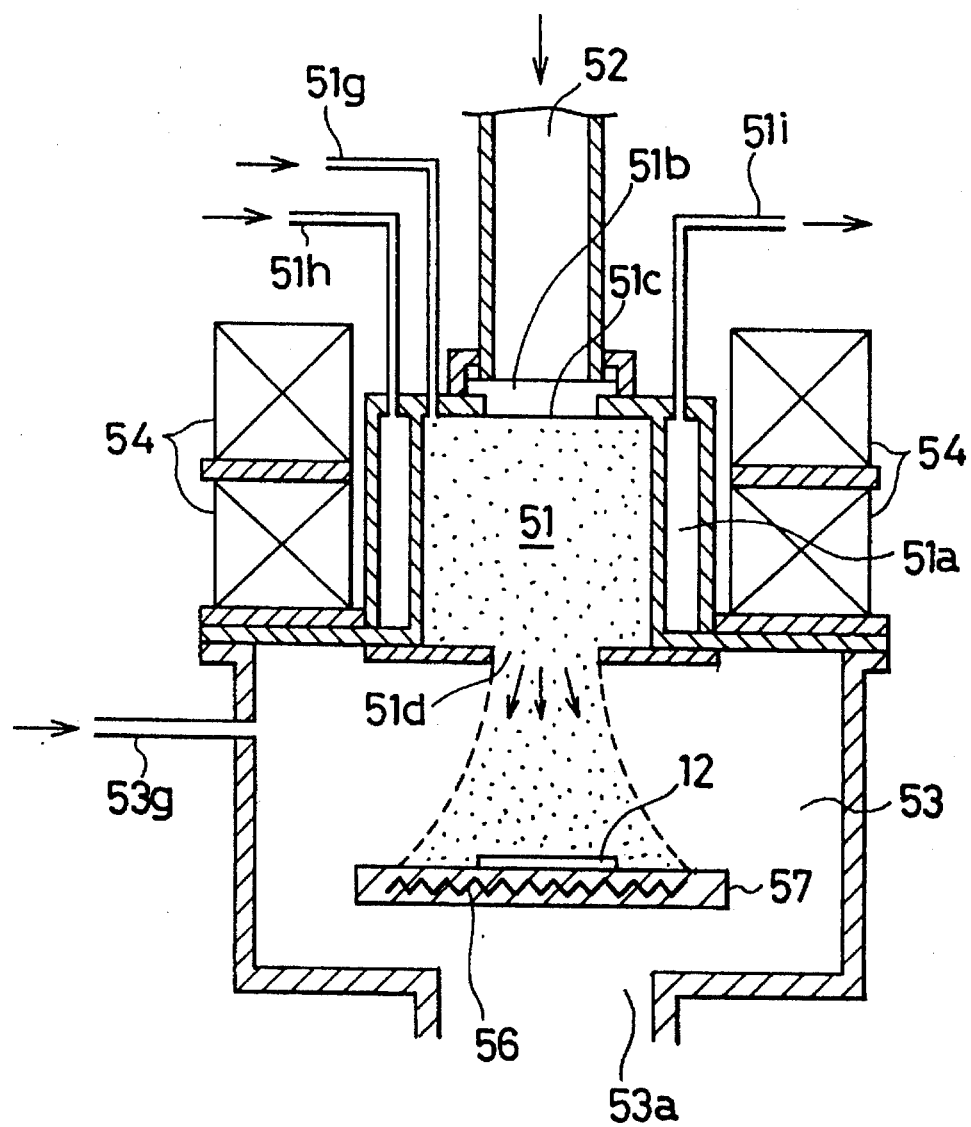
FIG. 3 is a diagrammatic sectional view showing an example of apparatus used for ERC-CVD method.

FIG. 3 is a diagrammatic sectional view showing an apparatus used for the ECR-CVD method, wherein reference numeral 51 represents a plasma generation chamber. The plasma generation chamber 51 has peripheral walls of double structure, inside which a cooling water conduction chamber 51a is formed, a microwave inlet 51c sealed with quartz glass plate 51b is formed in the center of the upper wall and plasma extraction window 51d is formed opposite to the microwave inlet 51c and the exciting coil 54, which surrounds them.

A sample stage 57, on which a sample such as the ceramic substrate 12 is placed, is arranged opposite to the plasma outlet window 51d in the sample chamber 53, and a heater 56 for heating the ceramic substrate 12 is buried in the sample stage 57. An exhaust port 53a is formed on the lower wall of the sample chamber 53 and is connected to an exhaust device (not shown). Reference numerals 51g, 53g, 51h and 51i in the figure represent a reactive gas supply system communicating to the plasma generation chamber 51, a reactive gas supply system communicating to the sample chamber 53, a cooling water supply system and a drainage system respectively.

After evacuating both the plasma generation chamber 51 and the sample chamber 53 to the desired high vacuum, gases containing metals are supplied through the reactive gas supply systems 51g and 53g into the plasma generation chamber 51 to obtain the desired gas pressure. A divergent magnetic field required for electron cyclotron resonance excitation is formed by the exciting coil 54, while a microwave is introduced through the microwave inlet 51c into plasma generation chamber 51, leading to formation of plasma by resonance excitation of the plasma generation chamber 51, which functions as a cavity resonator. The generated plasma is projected to the periphery of the ceramic substrate 12 in the sample chamber 53 by the divergent magnetic field formed by the exciting coil 54 having a magnetic flux density which diminishes in the direction of the sample chamber 53. The desired metallic thin film, desired metallic compound thin film or alloy film containing the desired metals is formed on the surface of the ceramic substrate 12 in the sample chamber 53. In this case, too, in order to form a more dense metallic thin film excellent in adhesion, it is preferable to form a metallic thin film during heating the ceramic substrate 12 with the heater 56 buried in the stage 57.

Use of the above-described PE-CVD or ECR-CVD methods makes it possible to form a conductive compound thin film whose composition changes continuously or by stages. In order to form a conductive compound thin film whose composition changes continuously, it is only required to supply a mixed gas into the reaction chamber while changing its composition continuously. In order to form a conductive compound thin film whose composition changes by stages, it is only required to supply a mixed gas into the reaction chamber changing its composition in stages.

In the present invention, at least the first one of plural metallic thin film layers is formed by a chemical vapor deposition method.

Figure 4:
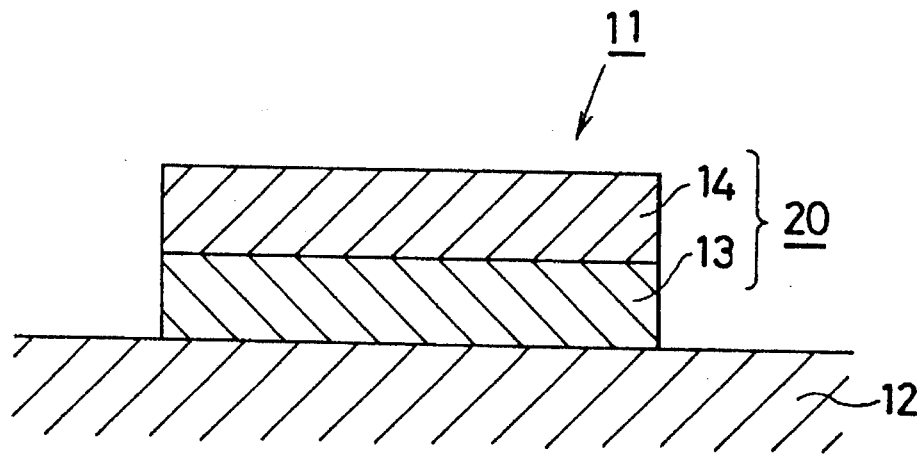
FIG. 4 is a diagrammatic sectional view showing the ceramic substrate having a multilayered metallic thin film according to an embodiment of the present invention.

FIG. 4 is a diagrammatic sectional view showing the ceramic substrate having a multilayered metallic thin film produced by the method for producing the same according to the present invention. The first metallic thin film layer 13 is formed on the surface of the ceramic substrate 12 by a chemical vapor deposition method and the second metallic thin film layer 14 is formed on the first metallic thin film layer 13 by a chemical or physical vapor deposition method, so that both of them constitute a multilayered metallic thin film 20 which constitutes a ceramic substrate having a multilayered metallic thin film 11 on the ceramic substrate 12. Here, the ceramic substrate 12 can be a multilayer interconnection substrate inside which a multilayer interconnection is formed.

The ceramic substrate 12 may be, for example, oxide group ceramic substrates such as alumina or non-oxide group ceramic substrates such as aluminum nitride and silicon carbide. An alumina substrate is preferred.

The first metallic thin film layer 13 is a bonding layer formed for connecting the ceramic substrate 12 with the second metallic thin film layer 14, which is formed by a chemical vapor deposition method as described above. In order to form the first metallic thin film layer 13, one or more elements selected from Ti, Zr, Cr, W and Hf are used. When alumina is used as the ceramic substrate 12, Ti which easily forms a compound with alumina, resulting in a tight connection with the alumina substrate, is preferred. In order to form a Ti metallic thin film by the above PE-CVD method, a titanium tetrachloride gas, at a gas pressure of several Torr, can be used. The thickness of the first metallic thin film layer 13 is preferably 0.01–2 μm, more preferably 0.05–0.5 μm, in order to completely coat and be firmly connected to a ceramic substrate 12 having an uneven surface and to adequately bond the first thin film to the second metallic thin film layer 14 even when there is diffusion at a high temperature.

The second metallic thin film layer 14 functions as a barrier layer, which inhibits the diffusion of metallic elements constituting the first metallic thin film layer 13, and is formed with one or more elements selected from Cr, Mo and Ni. The second metallic thin film layer 14 can be formed by the above chemical vapor deposition method and also by a physical vapor deposition method, such as vacuum evaporation or sputtering. Especially, when the first metallic thin film layer 13 is chemically unstable, forming the second metallic thin film layer 14 by the chemical vapor deposition method successfully stabilizes the first metallic thin film layer 13. The thickness of the second metallic thin film layer 14 is preferably 0.01–1 μm, more preferably 0.05–05 μm in order to sufficiently inhibit the diffusion of metallic elements constituting the first metallic thin film layer 13.

Figure 5:
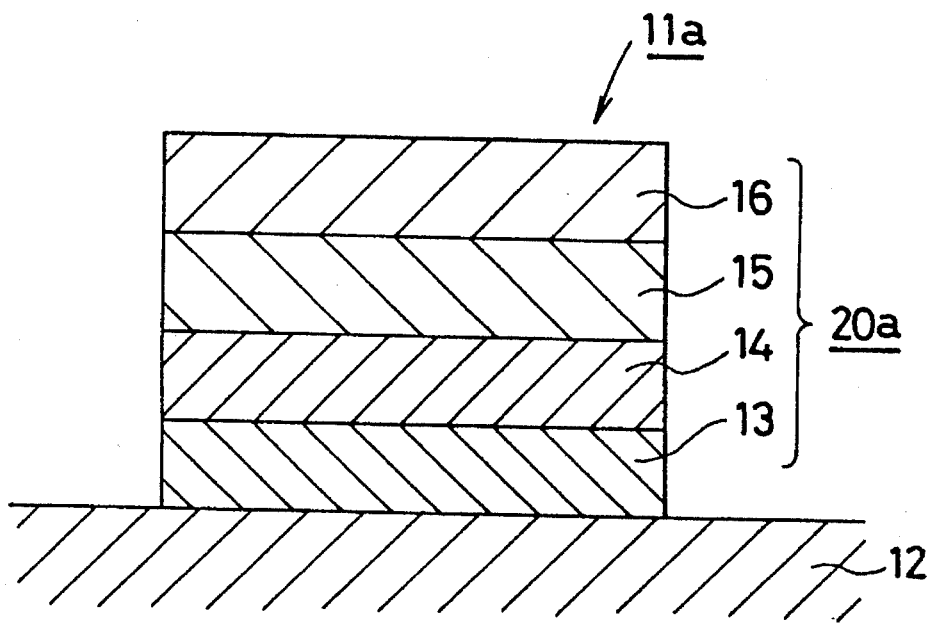
FIG. 5 is a diagrammatic sectional view showing the ceramic substrate having a multilayered metallic thin film according to another embodiment of the present invention.

FIG. 5 is a diagrammatic sectional view showing the ceramic substrate having a multilayered metallic thin film 1 1a wherein the third metallic thin film layer 15 and a coating layer 16 are formed on the second metallic thin film layer 14. The first metallic thin film layer 13 is formed by chemical vapor deposition on the surface of the ceramic substrate 12, the second metallic thin film layer 14 working as a barrier layer is formed by a chemical or physical vapor deposition on the first metallic thin film layer 13, the third metallic thin film layer 15 serving as a base layer for plating is formed on the second metallic thin film layer 14, and the coating layer 16 is formed on the third metallic thin film layer 15. The first metallic film layer 13, the second metallic thin layer 14, the third metallic thin film layer 15 and the coating layer 16 constitute a multilayered metallic thin film 20a which constitutes a ceramic substrate having a multilayered metallic thin film 1 1a with the ceramic substrate 12.

Any metallic element, such as Cu, Ag, Ni and Au, can be used for forming the third metallic thin film layer 15 so long as it functions as a base layer for plating. The third metallic thin film layer 15 can be formed by chemical vapor deposition and also by a physical vapor deposition such as by vacuum evaporation or by sputtering. The thickness of the third metallic thin film layer 15 is preferably 0.1 μm–0.5 μm, more preferably 0.05–0.5 μm, when the reliability (stress distortion and prevention of film peeling) of the multilayered metallic thin film 20a after plating is considered.

The coating layer 16 is usually formed by a chemical plating treatment, and in forming the coating layer 16, Cu, Ag, Au, and the like are used. The thickness of the coating layer 16 is preferably 1–15 μm, taking into consideration the reliability in connecting leads, etc.

Forming at least the first metallic thin film layer 13 by chemical vapor deposition makes it possible to satisfactorily coat with a metallic thin film even the inside of the pores 23 on the ceramic substrate 12. And when the metallic thin film layers 14, 15 and the coating layer 16 are formed, their coating properties are good, and the ceramic substrate 12 and the multilayered metallic thin film 20a are tightly connected.

The ceramic substrate having a multilayered metallic thin film according to the present invention, wherein plural metallic thin film layers are formed on the ceramic substrate, is characterized by having;

the first metallic thin film layer comprising one or more elements selected from Ti, Zr, Cr and W formed on the ceramic substrate;

the second metallic thin film layer comprising one or more elements selected from Ni, and Mo formed on the first metallic film layer;

the third metallic thin film layer comprising one or more elements selected from the IB group in the periodic table formed on the second metallic thin film layer;

the fourth metallic thin film layer comprising the same elements as the second metallic thin film layer formed on the third metallic thin film layer; and the fifth metallic thin film layer comprising the same elements as the third metallic thin film layer formed on the fourth metallic thin film layer.

the fifth metallic thin film layer comprising the same elements as the third metallic thin film layer formed on the fourth metallic thin film layer.

In the ceramic substrate having a multilayered metallic thin film according to the present invention, the first metallic thin film layer is completely prevented from diffusing to the fifth metallic thin film layer by the existence of the third and fourth metallic thin film layers, so that the ceramic substrate and the multilayered metallic thin film formed thereon, and every metallic thin film layer in the multilayered metallic thin film are tightly bonded to each other. As a result, a multilayered metallic thin film whose film adhesion strength is more than 3 kg/mm$^2$ and not deteriorated by thermal shock is formed.

The first metallic film layer comprises one or more elements selected from Ti, Zr, Cr and W, has a high activity to the ceramic substrate and easily diffuses into the ceramic substrate, becoming tightly connected therewith. The first metallic thin film layer also diffuses readily into the second metallic thin film layer comprising one or more elements selected from Ni and Mo, and becomes tightly connected therewith.

When alumina is the ceramic substrate and Ti is used for forming the first metallic thin film layer, Ti forms a compound with alumina, and the first metallic thin film layer and the ceramic substrate are tightly bonded to each other. In addition, Ti readily forms an alloy with Mo, or the like, constituting the second metallic thin film layer, and the first metallic thin film layer is tightly bonded to the second metallic thin film layer.

The second and fourth metallic thin film layers comprise the same metals and between them the third metallic thin film layer comprises one or more elements selected from group IB in the periodic table. Ti, which dissolves mainly in group IB elements, does not pass through these layers and diffuse into the fifth metallic thin film layer. Thus, deterioration of film adhesion strength of the coating layer of the outermost layer caused by the diffusion of the first metallic thin film layer is prevented.

Metals used for the third metallic thin film layer are for example, Cu, Au and Ag. The fifth metallic thin film layer comprises the same metallic elements as the third metallic thin film layer.

Forming a multilayered metallic thin film by piling up after alternate metallic thin film layers comprising different sorts of metals allows each metallic thin film layer to diffuse into each other, to be tightly bonded to each other and also to be tightly bonded to the ceramic substrate. The ceramic substrate having a multilayered metallic thin film according to the present invention, wherein plural thin film layers of metals or a compound containing metals are formed on the ceramic substrate, is characterized by having at least:

a first metallic thin film layer comprising one or more elements selected from the IV A group in the periodic and table formed on the ceramic substrate; and a second thin film layer comprising a compound containing the elements which constitute the first metallic thin film layer formed thereon.

Figure 6:
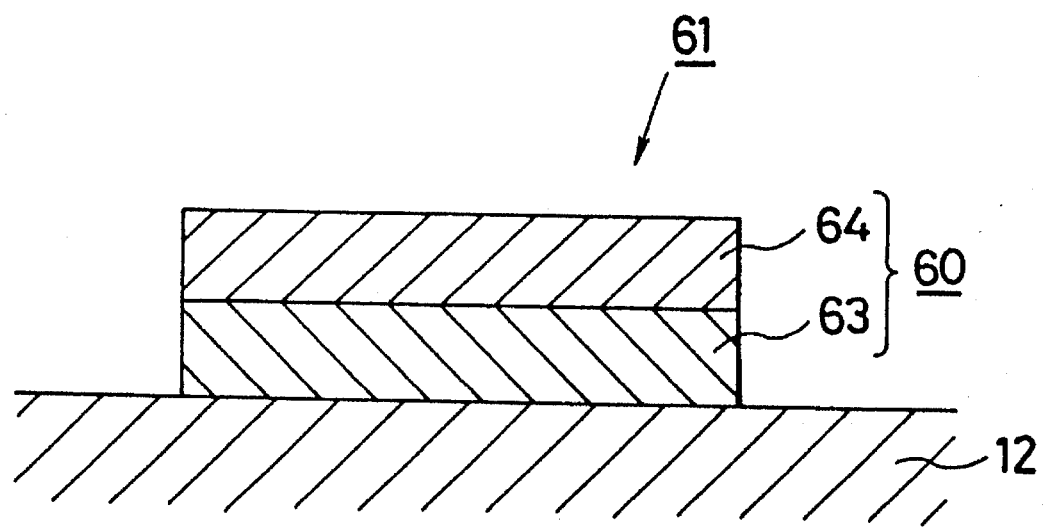
FIG. 6 is a diagrammatic sectional view showing the ceramic substrate having a multilayered metallic thin film according to an embodiment of the present invention.

FIG. 6 is diagrammatic sectional view showing one example of the ceramic substrates having a multilayered metallic thin film according to the present invention. The first metallic thin film layer 63 comprising one or more elements selected from the A group IV A of the period table is formed on the surface of the ceramic substrate 12 by a physical or chemical vapor deposition method, and the second thin film layer 64 comprising a compound containing the elements which constitute the first metallic thin film layer 63 is formed thereon by a chemical or physical vapor deposition method. Both of them constitute a multilayered thin film 60 on the ceramic substrate 12.

The first thin film layer 63 is a bonding layer formed for connecting the ceramic substrate 12 with the second thin film layer 64. Metals for forming the first metallic thin film layer 63, are Ti, Zr, Hf and the like. When alumina is used as the ceramic substrate 12, Ti, which readily forms a compound with alumina and which is tightly bonded to the alumina substrate, is preferred. The thickness of the first metallic thin film layer 63 is preferably 0.01–2 µm, more preferably 0.05–0.5 µm, in order to be firmly connected to the ceramic substrate 12 and the second thin film layer 64 even at a high temperature.

A compound used for forming the second thin film layer 64 may contain a metal constituting the first metallic thin film layer 63, for example a compound of titanium, such as TiNx, or an alloy of titanium, such as TiWx. The composition of the compound constituting the second thin film layer 64 is important in order to inhibit the diffusion of the metallic elements constituting the first metallic thin film layer 63.

Figure 7:
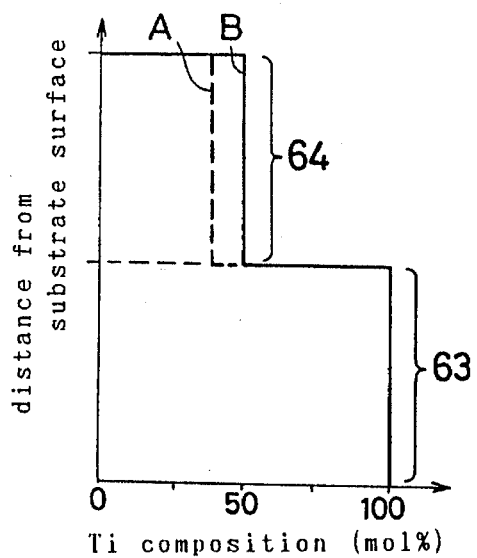
FIG. 7 comprises graphs indicating the changes of the compositions of Ti in the direction of film thickness of the first metallic thin film layer and the second thin film layer when TiNx is used for the second thin film layer, in the case that; (a) the content of Ti in the second thin film layer is definite; (b) the content of Ti in the second thin film layer decreases successively at a definite rate in the direction of film thickness; and (c) the content of Ti in the second thin film layer changes doubly by stages.
Figure 7:
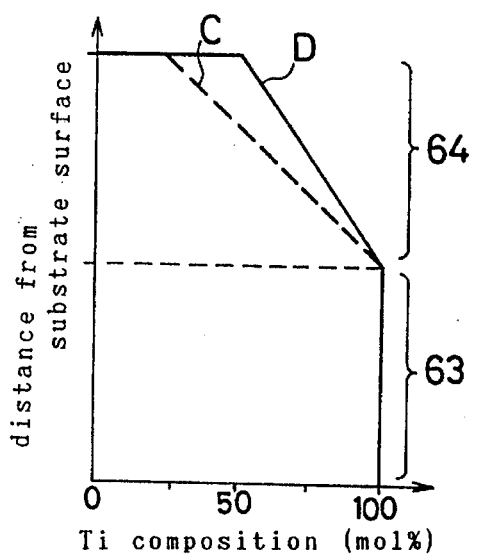
Figure 7:
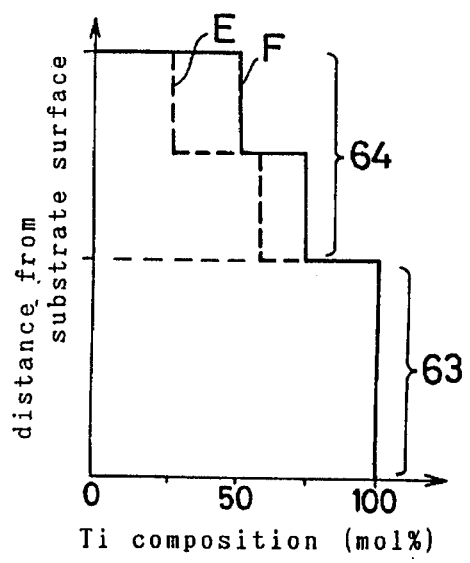

FIG. 7 comprises graphs indicating changes of the Ti compositions of the first metallic thin film layer 63 and the second thin film layer 64 in the direction of film thickness when TiNx is used for forming the second thin film layer 64. FIG. 7 (a) shows the change when the Ti content in the second thin film layer 64 is constant, FIG. 7 (b) shows the change when the Ti content in the second thin film layer 64 decreases continuously at a definite rate in the direction of film thickness, and FIG. 7 (c) shows the change when the Ti content in the second thin film layer 64 changes by stages.

In FIGS. 7(a), (b) and (c), each of segments A,B,C,D,E and F illustrates the case where the Ti contents differ from each other. It is desired that the composition of TiNx should be selected so that x in TiNx is about 0.4–1 (about 50–72 mol%, when converted into mol % of Ti in TiNx). The Ti content can be smaller than the upper limit for solid solution and the Ti ratio can be as small as possible (eg. such values as indicated with dotted lines A,C and E). The thickness of the second thin film layer 64 is preferably 0.01–1 µm, in order that the diffusion of the first metallic thin film layer 63 can be sufficiently inhibited.

In the present invention, the third metallic thin film layer which functions as a barrier layer on the second thin film layer 64 for further preventing the metals of the first metallic thin film layer 63 from diffusing. The fourth metallic thin film layer functions as a base layer for plating on the third metallic thin film layer, and a coating layer may be formed on the fourth metallic thin film layer. It is not always necessary to form all the thin film layers between the first metallic thin film layer 63 and the coating layer on the ceramic substrate; that is, any of three-, four and five-layer structures, as well as the above two-layer structure, can be utilized.

Figure 8:
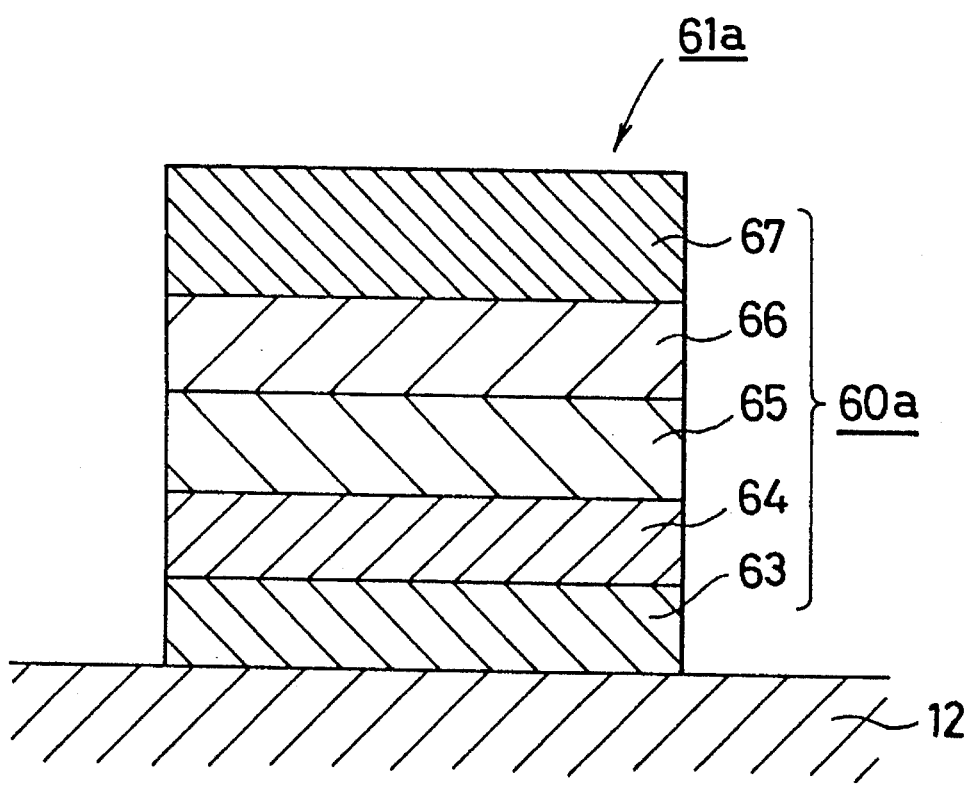
FIG. 8 is a diagrammatic sectional view showing the ceramic substrate having a multilayered metallic thin film according to another embodiment of the present invention.

FIG. 8 is a diagrammatic sectional view showing a ceramic substrate having a multilayered metallic thin film 61a, wherein the third metallic thin film layer 65, the fourth metallic thin film layer 66 and a coating layer 67 are formed successively on the second metallic thin film layer 64. The first metallic thin film layer 63 comprises one or more elements selected from group IV A of the period table and is formed on the surface of the ceramic substrate 12. The second thin film layer 64 comprises a compound containing the elements constituting the first metallic thin film layer 63; the third metallic thin film layer 65 functions as a barrier layer; the fourth metallic thin film layer 66 functions as a base layer for plating; and the coating layer 67 is formed on the fourth metallic thin film layer 66. The first metallic thin film layer 63, the second thin film layer 64, the third metallic thin film layer 65, the fourth metallic thin film layer 66 and the coating layer 67 constitute a multilayered metallic thin film 60a which constitutes a ceramic substrate having a multilayered metallic thin film 61a on the ceramic substrate 12.

Any metal can be used for forming the third metallic thin film layer 65 so long as it can inhibit the metallic elements used for forming the first metallic thin film layer 63 from diffusing further to the tipper layers. A Mo layer in which a thin layer of Fe or Cu is included (Mo/Cu/Mo) is preferred. The thickness of the third, metallic thin film layer 65 is preferably 0.01–1 µm, more preferably 0.01–0.5 µm, when the prevention of diffusion and stress relaxation of the metallic elements constituting the first metallic thin film 63 are considered.

Any metal can be used for forming the fourth metallic thin film layer 66 so long as it functions as a base layer for plating; and Cu and Ni are preferred. The thickness of the fourth metallic thin film layer 66 is preferably 0.01–0,5 µm, more preferably 0.05–0.5 µm, when the reliability (stress distortion and prevention of film peeling) of the multilayered metallic thin film 60a after plating are considered.

The coating layer 67 is usually formed by a chemical plating treatment, wherein Cu, Ag, and the like are preferably used. The thickness of the coating layer 67 is preferably 1–15 µm, more preferably 5–10 µm, taking into consideration the reliability in bonding leads, etc.

By forming the multilayered metallic thin film 60a having a structure in which the thermal diffusion of the metallic elements constituting the first metallic thin film layer 63 is more effectively prevented, the ceramic substrate 12 and the multilayered metallic thin film 60a are connected tightly and every thin film layer is also tightly connected to each other.

Each of the first to fourth metallic thin film layers 63–66 can be formed by a physical or chemical vapor deposition method. The physical vapor deposition method includes vacuum evaporation or sputtering or the like, and the chemical vapor deposition method includes plasma CVD wherein direct current electricity, radio frequency microwave, both microwave and magnetic field or electron cyclotron resonance are used, a thermal CVD method, a reactive sputtering or reactive evaporation method wherein sputtering or vacuum evaporation is used while supplying reactive gases. When the surface of the substrate 12 is uneven, in order to obtain a good coating, forming the metallic thin film layer 63 and the second thin film layer 64 by chemical vapor deposition, where the reaction pressure in film formation is fairly high, around 1 Torr, and the mean free path of atoms is relatively short, is preferred. The PE-CVD using electron cyclotron resonance is particularly preferred.

In order to form a chemically evaporated film on the ceramic substrate 12 using the PE-CVD apparatus shown in FIG. 2, after the ceramic substrate 12 is placed on the sample stage 44 in the plasma reaction chamber 41, the plasma reaction chamber 41 is evacuated to about $10^{-6}$ Torr by using main exhaust system 50g. Then, while evacuating through the reactive gas exhaust system 49g, a gas containing metallic atoms is supplied to provide the desired gas pressure. A plasma is generated by applying RF electricity of, 13.56 MHz for example, to the RF electrode 43 by the RF generation source 46. A thin film of the desired metals, a compound containing the desired metals or an alloy containing desired metals is formed on the ceramic substrate 12. In order to form a more dense thin film excellent in adhesion, it is preferable to form the thin film while heating the ceramic substrate 12 to about 300° C. using the heater 47 buried in the sample stage 44.

In order to conduct chemical evaporation using the ECR-CVD apparatus shown in FIG. 3, after evacuating both the plasma generation chamber 51 and the sample chamber 53 to the desired high vacuum, gases containing metals, are supplied through the reactive gas supply system 51g and 53g into the plasma generation chamber 51 to obtain the required gas pressure. The magnetic field required for electron cyclotron resonance excitation is formed by the exciting coil 54, while a microwave is introduced through the microwave inlet 51c into the plasma generation chamber 51. A plasma is formed by resonance excitation of the gases in the plasma generation chamber 51, which functions as a cavity resonator. The plasma is projected to the periphery of the ceramic substrate 12 in the sample chamber 53 by the divergent magnetic field formed by the exciting coil 54 having a magnetic flux density which diminishes in the direction of the sample chamber 53. A thin film of the desired metal compound containing the desired metals or an alloy containing the desired metals is formed on the surface of the ceramic substrate 12 in the sample chamber 53. In this case, too, in order to form a more dense thin film excellent in adhesion, it is preferable to form the thin film while heating the ceramic substrate 12 with the heater 56 buried in the sample stage 57.

In order to form a TiNx thin film whose composition changes continuously by the PE-CVD or ECR-CVD method, as shown in FIG. 7(b) it is only required to supply a mixture of titanium tetrachloride and nitrogen successively changing the mixture ratio being supplied to the reaction chamber. In order to form a TiNx thin film whose composition changes by stages, as shown in FIG. 7(c), it is only required to supply the gases with the composition changed by stages.

The resultant first metallic thin film layer comprises more than one element selected from the group IV A of the period table formed on the ceramic substrate. That layer is highly reactive with the ceramic substrate, and easily diffuses into and is firmly bonded to the ceramic substrate. Since the second metallic thin film layer comprises a compound containing the elements which constitute the first metallic thin film layer, which diffuse into the second metallic thin film layer, the metallic elements constituting the first metallic thin layer, which diffuse into the second metallic thin film layer on heating at a high temperature dissolve in that layer and diffusion into the upper layers is prevented. In addition, such dissolution allows the first metallic thin film and the second thin film to be tightly connected to each other. As a result, the ceramic substrate and the multilayered metallic thin film formed thereon, and all of the thin film layers in the multilayered metallic thin film are tightly connected to each other, and adhesion between the coating film formed on the multilayered metallic thin film and the multilayered metallic thin film is also improved.

The ceramic substrate having a multilayered metallic thin film according to the present invention, wherein plural metallic thin film layers are formed on the ceramic substrate, is characterized by moving a first metallic thin film layer comprising one or more elements selected from Ti, Zr, Cr and W on the ceramic substrate, a second metallic thin film layer comprising Fe, or an alloy containing Fe on the first metallic thin film layer, a third metallic thin film layer comprising one or more elements selected from Ni and Mo on the second metallic thin film layer and a fourth metallic thin film layer comprising one or more elements selected from Cu, Ag and Au on the third metallic thin film layer.

The ceramic substrate may be oxide group ceramic substrates, such as alumina, or non-oxide group ceramic substrates such as aluminum nitride and silicon carbide. For strong adhesion of the metallic film to the substrate an alumina substrate is used.

When forming the first metallic thin film layer, more than one element selected from Ti, Zr, Cr and W are used. The first metallic thin film layer comprising these elements is highly reactive with the ceramic substrate, and readily diffuses into and is tightly bonded to the substrate. The thickness of the first metallic thin film layer is preferably 0.01–2 μm, more preferably 0.05–0.20 μm, in order that the bonding between the ceramic substrate and the second metallic thin film layer can be adequately maintained even on diffusion at a high temperature.

When forming, the second metallic thin film layer, Fe or an alloy containing Fe is used. Fe is a metal which very readily forms a compound with Ti or the like in the first metallic thin film layer and also with Ni or the like in the third metallic thin film layer. Thus, the first and third metallic thin film layers are tightly bonded through the intermediary of the second metallic thin film layer comprising Fe or an alloy containing Fe.

In order to form an alloy between the first and third metallic thin film layers, it is required that the second metallic thin film layer be at least 0.01 μm thick. Since the second metallic thin film layer, which is formed by evaporation and which is more than 0.05 μm thick, allows rust to readily form on Fe, the thickness of the second metallic thin film layer is preferably 0.01–0.05 μm, more preferably 0.02–0.03 μm.

It is preferred that more than 10% of Fe is contained in the Fe-containing alloy. Since Fe is readily oxidized in air containing moisture, it is preferred that of formation the second metallic thin film layer be conducted in ultra-high vacuum containing neither moisture nor air.

When forming the third metallic thin film layer, more than one element selected from Ni and Mo on the like are used. The third metallic thin film layer functions as a barrier layer to prevent diffusion of the metallic elements constituting the first metallic thin film layer. The thickness of the third metallic thin film layer is preferably 0.01–1 μm, more preferably 0.10–0.50 μm, when the prevention of diffusion and stress relaxation of the first metallic thin film layer are considered.

When forming the fourth metallic thin film layer, one or more elements selected from Cu, Ag and Au are used. The fourth metallic thin film layer functions as a base for plating. The thickness of the fourth metallic thin film layer is preferably 0.01–0.50 μm, more preferably 0.10–0.30 μm, when film peeling and stress distortion after plating are considered.

A coating layer, 3–4 μm thick, is usually formed on the fourth metallic thin film layer using Au or the same elements as the fourth metallic thin film layer.

In the ceramic substrate having a multilayered metallic thin film thereon, which has the above-described structure, the ceramic substrate and the first metallic thin film layer are tightly connected, the first and third metallic thin film layers are tightly connected due to the existence of the second metallic thin film layer, and the metals in the first metallic thin film layer do not diffuse to the tipper layers. Thus, a metallic thin film layer excellent in adhesion strength is formed on the ceramic substrate.

DESCRIPTION OF PREFERRED EMBODIMENTS

Examples and Comparative Examples of ceramic substrates having a multilayered thin film according to the present invention are described below with reference to the Figures of the drawings.

EXAMPLES 1 AND 2

A fine interconnection pattern was formed on a well washed alumina substrate 12 of 92% purity using the ECR-CVD apparatus shown in FIG. 3. An alumina substrate 12 by 2 inches square and 1 mm thick was placed on the sample stage 57 and the apparatus was evacuated to a high vacuum, while heating the alumina substrate 12 to 500° C. When the temperature of the alumina substrate 12 became stable, Ar gas was introduced into the plasma generation chamber 51 from the supply system 51g and an ECR plasma was generated. The strength of the ECR magnetic field at that time was 875G and the microwave electricity was 500W. Then, titanium tetrachloride ($TiCl_4$) gas was introduced into the sample chamber 53 from the reactive gas supply system 53g, the pressure inside the sample chamber 53 was set to be about $10^{-2}$ Torr and the thickness of the Ti filth after 5 minutes was found to be 0.5 μm.

Heating was discontinued and when the temperature of the alumina substrate 12 became less than 100° C., the alumina substrate 12 was taken out of the ECR-CVD apparatus. The Ti film was lightly etched with 10% hydrofluoric acid, rinsed and dried, and placed in the magnetron sputtering apparatus. Then, the magnetron sputtering apparatus was evacuated to $1\times10^{-6}$ Torr, Ar gas was introduced, the pressure was set to be 5mTorr, and the substrate temperature set to be 120° C. Thin films of Ti, Mo, Cu, Mo and Cu, 0.1 μm, 0.2 μm, 0.05 μm, 0.2 μm and 0.1 μm thick, respectively, were successively formed on the Ti film.

Next, thin films of Ti, Mo and Cu, 0.1 μm, 0.2 μm and 0.1μm thick, respectively, were formed in that order by sputtering on a Ti film which was formed by a chemical vapor deposition method on another alumina substrate in the same manner as the sample in the previous example.

Both samples in Examples 1 and 2 were irradiated after sputtering at a substrate temperature of less than 50° C., after the alumina substrates 12 were taken out of the magnetron sputtering apparatus, and resist patterns 10 μm in film thickness were formed by photolithography. Coatings of Cu, 6 μm thick, were formed in the grooved sections of the resist patterns by electroplating, and the resists were peeled off. Then, wet etching was conducted on the multilayered thin films, and the formation of outer layer fine interconnection patterns was completed. The line width and space of the formed outer layer fine interconnection patterns were 100 μm and 50 μm respectively.

The film adhesion strengths of the resultant ceramic substrates having a multilayered metallic thin film thereon were measured as the adhesion strength at the time when a film was broken by soldering Ni leads about 1 mm in diameter onto the film surface and pulling every pin at a speed of 10 mm/min. The surfaces of the ceramic substrates having a multilayered metallic thin film thereon were observed using a scanning electron microscope (SEM). The results of the film adhesion strength test and the SEM observation are shown in Table 1.

COMPARATIVE EXAMPLE 1

A multilayered metallic thin film was formed on an alumina substrate similar to the one used in Example 1. The alumina substrate was placed in the magnetron sputtering apparatus, which was evacuated to $1\times10^{-6}$ Torr, while the substrate temperature was set to be 120° C. After the substrate temperature became stable, Ar gas was introduced into the apparatus and the pressure was set at 5 mTorr, and a multilayered metallic thin film composed of thin films of Ti, Mo, Cu, Mo and Cu, formed in that order, 0.1 μm, 0.02 μm, 0.05 μm, 0.2 μm, and 0.1 μm thick respectively, was formed on the alumina substrate.

After sputtering in the same manner as in Example 1, a resist pattern was formed and a coating of Cu, 6 μm thick, was formed in the grooved section of the resist pattern by electroplating. Then, wet etching was conducted on the multilayered metallic thin film, and the formation of an outer layer fine interconnection pattern was completed. The line width and space of the formed outer layer fine interconnection pattern were 100 μm and 50 μm respectively.

The results of the film adhesion strength test and the SEM observation of the surface of the ceramic substrate having a multilayered metallic thin film thereon are shown in Table 1.

COMPARATIVE EXAMPLE 2

A multilayered metallic thin film composed of thin films of Ti, Mo and Cu, formed in that order, 0.1 μm, 0.2 μm and 0.1 μm thick, respectively, was formed on an alumina substrate similar to the one used in Example 1 using the same apparatus as in Comparative Example 1. After sputtering in the same manner as in Example 1, a resist pattern was formed and a coating of Cu, 6 μm thick, was formed in the grooved section of the resist pattern by electroplating.

Then, wet etching was conducted on the multilayered metallic thin film, and the formation of an outer layer fine interconnection pattern was completed. The line width and space of the formed outer layer find interconnection pattern were 100 μm and 50 μm respectively.

The results of the film adhesion strength test and the SEM observation of the surface of the ceramic substrate having a multilayered metallic thin film thereon are shown in Table 1.

TABLE 1

|  | film adhesion strength (kg/mm$^2$) | observations of ceramic substrate surface after Cu plating |
| --- | --- | --- |
| Example 1 | 4.2 | homogeneously coated with Cu coating |
| Example 2 | 3.8 | homogeneously coated with Cu coating |
| Comparative Example 1 | 2.5 | parts of surface not coated with Cu coating |
| Comparative Example 2 | 2.5 | parts of surface not coated with Cu coating |

As is apparent, from Table 1, the ceramic substrates having a multilayered thin film according to Examples 1 and 2 exhibited a high film adhesion strength, and the surfaces of both substrates were homogeneously coated with Cu. The ceramic substrates having a multilayered, metallic thin film thereon according to Comparative Examples 1 and 2 had a low film adhesion strength, and portions of their surfaces were found not to be coated with Cu. Since the first metallic thin film layer in the Comparative Examples was formed by a physical vapor deposition method, it was inadequately coated to the ceramic substrate, resulting in inadequate coating even on portions of the upper layer.

In the method for forming a ceramic substrate having a multilayered metallic thin film according to Examples 1 and 2, since Ti is formed on the ceramic substrate 12 by a chemical vapor deposition method, it is possible to coat even the inside of pores existing on the surface of the ceramic substrate 12 with the Ti thin film. The upper metallic thin films are more strongly bonded to the first thin layer, to each other and to the outer layer and coating. Thus, the ceramic substrate 12 and the multilayered metallic thin film are tightly bonded to each other, and a ceramic substrate having a multilayered metallic thin film thereon which has a high film adhesion strength can be formed.

EXAMPLE 3

Figure 9:
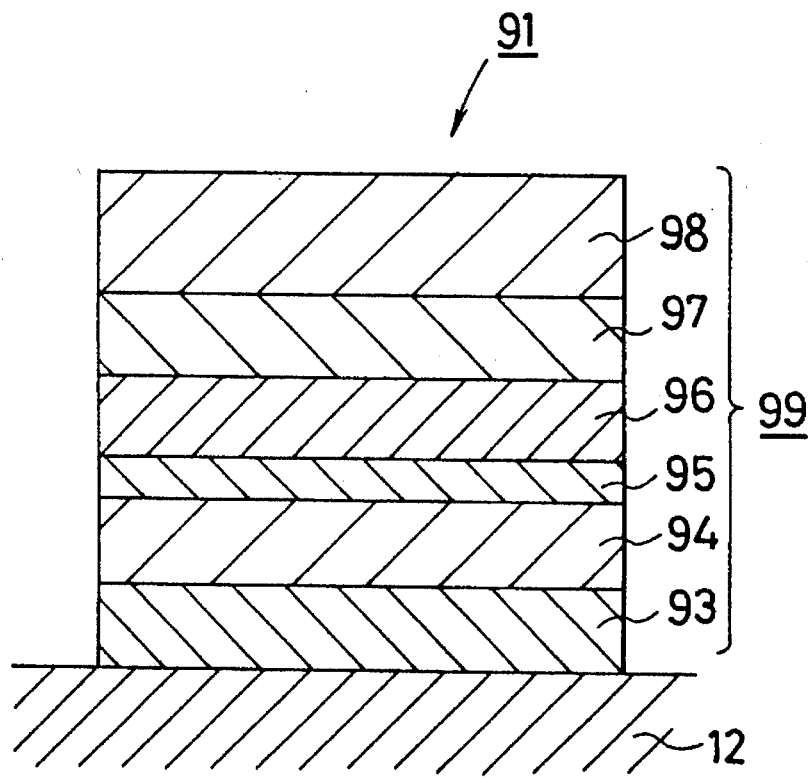
FIG. 9 is a diagrammatic sectional view showing the ceramic substrate having a multilayered metallic thin film according to still another embodiment of the present invention.
Figure 10:
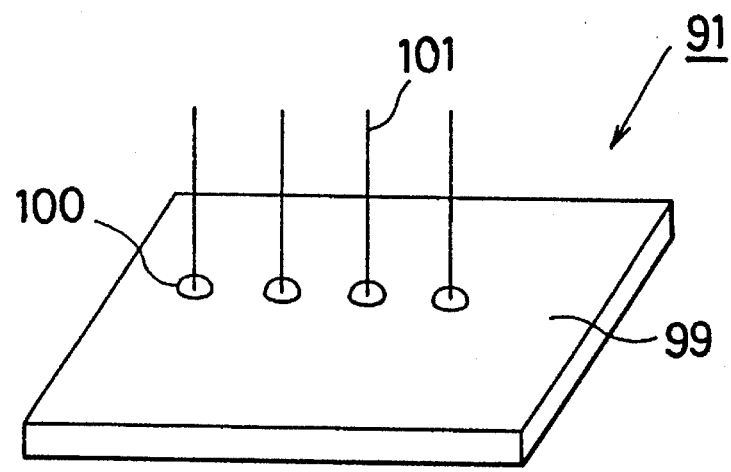
FIG. 10 is an oblique view of a ceramic substrate having a multilayered metallic thin film shown in order to explain a method of measuring film adhesion strength by a peel test.

FIG. 9 is a diagrammatic sectional view showing the structure of the ceramic substrate 12 having a multilayered metallic thin film thereon. Formed on the alumina substrate are a first metallic thin film layer 93 comprising Ti, a second metallic thin film layer 94 comprising Mo on the first metallic thin film layer 93, a third metallic thin film layer 95 comprising Cu on the second metallic thin film layer 94, a fourth metallic thin film layer 96 comprising Mo on the third metallic thin film layer 95, a fifth metallic thin film layer 97 comprising Cu on the fourth metallic thin film layer 96, and a coating layer 98 as the outermost layer on the fifth metallic thin film layer 97. The first metallic thin film layer 93, the second metallic thin film layer 94, the third metallic thin film layer 95, the fourth metallic thin film layer 96, the fifth metallic thin film layer 97 and the coating layer 98 constitute a multilayered metallic thin film 99. Reference numeral 91 designates the ceramic substrate 12 having a multilayered metallic thin film 99 thereon which is prepared as follows:

The first metallic thin film layer 93 having a thickness of 0.05–0.20 μm is 25 formed using Ti which reacts readily, when using a chemical or physical vapor deposition method, with the $Al_2O_3$ in the ceramic substrate 12.

The second metallic thin film layer 94 comprising Mo, the third metallic thin film layer 95 comprising Cu and the fourth metallic thin film layer 96 comprising Mo are formed on the first metallic thin film layer 93 by a chemical or physical vapor deposition method. The thickness of the second metallic thin film layer 94 is set to be 0.10–0.20 μm, that of the third metallic thin film layer 95 is set to be 0.01–0.02 μm and that of the fourth metallic thin film layer 96 is set to be 0.10–0.30 μm. The second metallic thin film layer 94, the third metallic thin film layer 95 and the fourth metallic thin film layer 96 function as barriers for preventing the first metallic thin film layer 93 from oozing out to the fifth metallic thin film layer 97. The third metallic thin film layer 95 is preferably a thin layer about 0.01–0.02 μm thick. When it is thicker than that, the film adhesion strength is apt to be lowered.

The fifth metallic thin film layer 97, having a thickness of 0.20–0.50 μm, is formed using Cu having a small circuit resistance by a chemical or physical vapor deposition method on the fourth metallic thin film layer 96. Then, the coating film layer 98, having a thickness of 3–4 μm for improving the circuit effect permitting the substrate to be used for a variety of purposes, is formed by a chemical plating. The coating layer 98 is formed using an element of the same group IB of the periodic table as the fifth metallic thin film layer 97.

Preferred values for the film thicknesses of the first metallic thin film layer 93 to the coating layer 98, when used for IC package are shown, but these thicknesses can be changed depending on the purposes for which the film-coated ceramic is to be used.

Physical vapor deposition methods such as vacuum evaporation, ion beam evaporation or sputtering method, are widely known. These methods have characteristics which makes it possible to select the quality and thickness of the films being formed. Chemical plating methods such as electroplating and electroless plating are well known and can be used.

Tables 2, 3 and 4 below shown the results of film adhesion strength tests of the ceramic substrate having a multilayered metallic thin film thereon according to the method of Example 3, varying the metals in the multilayered metallic thin films. The film adhesion strengths were measured by both a conventional peel test and a peel test after cycling 200 times at temperatures between +150° C. and −60 changing the temperature 10° C./min for 30 minutes.

TABLE 2

| | ceramic substrate | metallic thin film | | | | | outermost layer | film adhesive strength (kg/mm²) | |
|---|---|---|---|---|---|---|---|---|---|
| | | first layer | second layer | third layer | fourth layer | fifth layer | coating layer | usual | after heat cycle |
| Example 3 | Al₂O₃ | Ti | Mo | Cu | Mo | Cu | Cu | 5.2 | 5.2 |
| Example 4 | | Ti | Ni | Cu | Ni | | | 3.8 | 3.7 |
| Example 5 | | Zr | Mo | Cu | Mo | | | 5.7 | 5.5 |
| Example 6 | | Zr | Ni | Cu | Ni | | | 3.4 | 3.1 |
| Example 7 | | Cr | Mo | Cu | Mo | | | 4.3 | 4.3 |
| Example 8 | | Cr | Ni | Cu | Ni | | | 4.2 | 4.0 |

| | ceramic substrate | metallic thin film | | | outermost layer | film adhesive strength (kg/mm²) | |
|---|---|---|---|---|---|---|---|
| | | first layer | second layer | third layer | coating layer | usual | after heat cycle |
| Comparative Example 3 | Al₂O₃ | Ti | Mo | Cu | Cu | 3.6 | 2.1 |
| Comparative Example 4 | | Ti | Ni | | | 2.8 | 2.5 |
| Comparative Example 5 | | Zr | Mo | | | 1.8 | 1.5 |
| Comparative Example 6 | | Zr | Ni | | | 1.6 | 1.7 |
| Comparative Example 7 | | Cr | Mo | | | 1.8 | 1.6 |
| Comparative Example 8 | | Cr | Ni | | | 2.7 | 1.1 |

TABLE 3

| | ceramic substrate | metallic thin film | | | | | outermost layer | film adhesive strength (kg/mm²) | |
|---|---|---|---|---|---|---|---|---|---|
| | | first layer | second layer | third layer | fourth layer | fifth layer | coating layer | usual | after heat cycle |
| Example 9 | Al₂O₃ | Ti | Mo | Ag | Mo | Ag | Cu | 3.8 | 3.2 |
| Example 10 | | Ti | Ni | Ag | Ni | | | 3.4 | 3.7 |
| Example 11 | | Zr | Mo | Ag | Mo | | | 5.7 | 5.6 |
| Example 12 | | Zr | Ni | Ag | Ni | | | 3.4 | 3.3 |
| Example 13 | | Cr | Mo | Ag | Mo | | | 4.3 | 4.1 |
| Example 14 | | Cr | Ni | Ag | Ni | | | 5.3 | 5.0 |

| | ceramic substrate | metallic thin film | | | outermost layer | film adhesive strength (kg/mm²) | |
|---|---|---|---|---|---|---|---|
| | | first layer | second layer | third layer | coating layer | usual | after heat cycle |
| Comparative Example 9 | Al₂O₃ | Ti | Mo | Ag | Cu | 2.3 | 0.8 |
| Comparative Example 10 | | Ti | Ni | | | 1.8 | 1.8 |
| Comparative Example 11 | | Zr | Mo | | | 0.5 | 0.5 |
| Comparative Example 12 | | Zr | Ni | | | 0.6 | 0.9 |
| Comparative Example 13 | | Cr | Mo | | | 2.3 | 1.2 |
| Comparative Example 14 | | Cr | Ni | | | 2.6 | 0.8 |

TABLE 4

| | ceramic substrate | metallic thin film | | | | | outermost layer | film adhesive strength (kg/mm$^2$) | |
| | | first layer | second layer | third layer | fourth layer | fifth layer | coating layer | usual | after heat cycle |
|---|---|---|---|---|---|---|---|---|---|
| Example 15 | Al$_2$O$_3$ | Ti | Mo | Au | Mo | Au | Cu | 4.5 | 4.4 |
| Example 16 | | Ti | Ni | Au | Ni | | | 3.8 | 3.8 |
| Example 17 | | Zr | Mo | Au | Mo | | | 5.1 | 5.2 |
| Example 18 | | Zr | Ni | Au | Ni | | | 5.5 | 5.3 |
| Example 19 | | Cr | Mo | Au | Mo | | | 3.8 | 3.6 |
| Example 20 | | Cr | Ni | Au | Ni | | | 3.9 | 4.0 |

| | ceramic substrate | metallic thin film | | | outermost layer | film adhesive strength (kg/mm$^2$) | |
| | | first layer | second layer | third layer | coating layer | usual | after heat cycle |
|---|---|---|---|---|---|---|---|
| Comparative Example 15 | Al$_2$O$_3$ | Ti | Mo | Au | Cu | 1.2 | 0.8 |
| Comparative Example 16 | | Ti | Ni | | | 1.1 | 1.2 |
| Comparative Example 17 | | Zr | Mo | | | 0.6 | 0.5 |
| Comparative Example 18 | | Zr | Ni | | | 0.3 | 0.3 |
| Comparative Example 19 | | Cr | Mo | | | 1.5 | 2.2 |
| Comparative Example 20 | | Cr | Ni | | | 2.0 | 1.8 |

As is apparent from Tables 2, 3 and 4, some of the ceramic substrate shaving a multilayered metallic thin film in Comparative Examples 3–20 had a film adhesion strength of more than 3 kg/mm$^2$, but their adhesion strengths measured after thermal shock were deteriorated and badly lowered. The ceramic substrates having a multilayered metallic thin film in Examples 3–20 had a stable adhesion strengths even after thermal shock, and could maintain a film adhesion strength value of more than 3 kg/mm$^2$.

Figure 11:
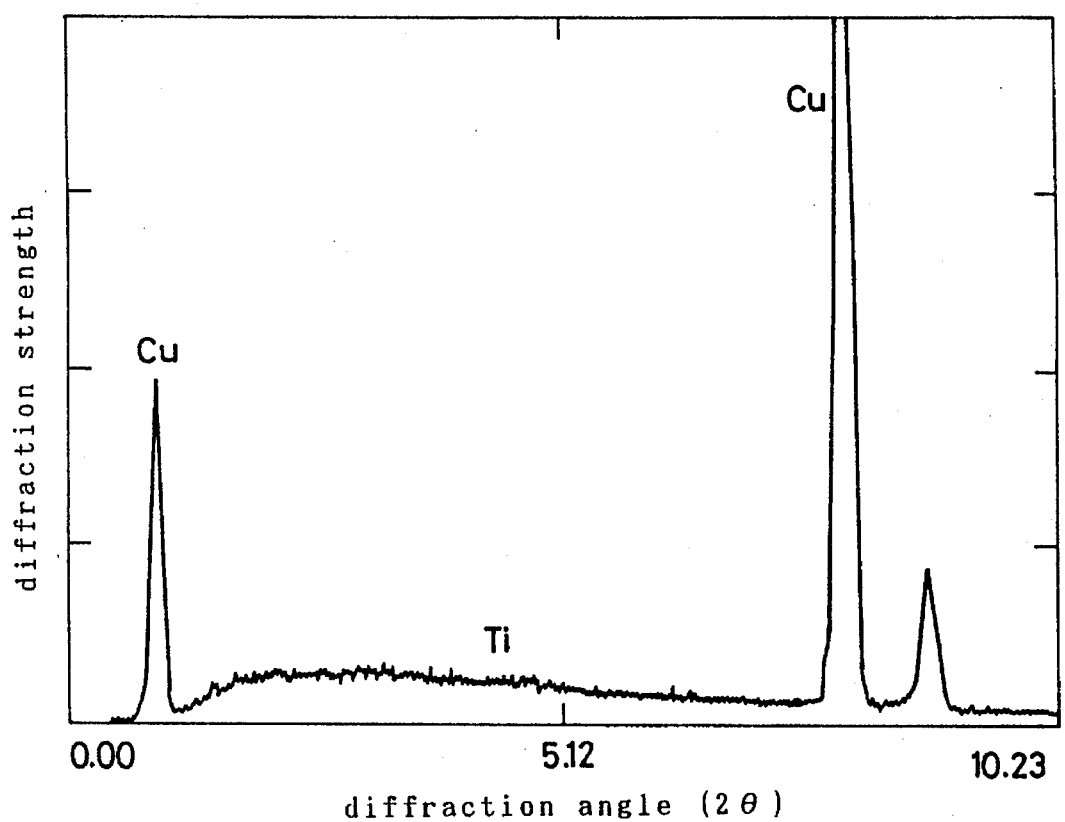
FIG. 11 is a graph indicating the result of element analysis by EPMA of the surface of the ceramic substrate having a multilayered metallic thin film obtained in Example 3 after heat treatment.
Figure 12:
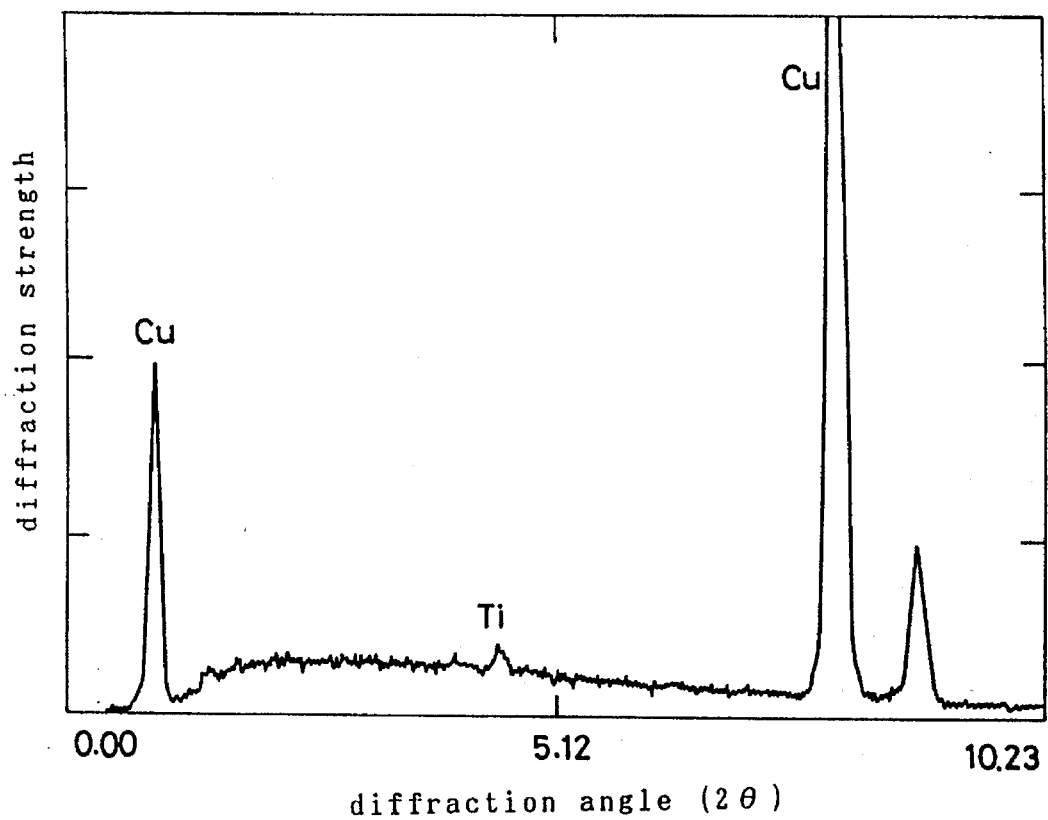
FIG. 12 is a graph indicating the result of element analysis by EPMA of the surface of the ceramic substrate having a multilayered metallic thin film obtained in Comparative Example 3 after heat treatment.

After heating at 850° C. for 10 minutes, the ceramic substrates having a multilayered metallic thin film obtained in Example 3 and Comparative Example 3 had their surfaces analyzed by EPMA. The results are shown in FIGS. 11 and 12 where the longitudinal axis shows diffraction strength and the transverse axis shows diffraction angle. As is apparent from those results, no titanium was found on the surface of the ceramic substrate having a multilayered metallic thin film thereon according to Example 3, while titanium was detected on the surface of the product of Comparative Example 3 due to thermal diffusion of the titanium.

After heating at 600° C. for 2 hours prior to electroplating, the ceramic substrates having a multilayered metallic thin film thereon of Example 3 and of Comparative Example 16, the product of Example 3 showed no color changes, while the product of Comparative Example 16 turned brown. It is apparent from these results that in conventional products Ti diffuses to the surface to the surface layer, while in the product of Example 3, thermal diffusion of Ti is prevented.

Diffusion to the surface in Example 3 was prevented because Ti in the first layer on heating diffuses into Mo in the second layer and further diffuses into Cu of the third layer and dissolves therein. Since Ti and Cu readily dissolve in each other, even if the Cu film is a thin film having a film thickness of around 0.01 μm, the Ti readily dissolves in the Cu. The portion of Ti, which fails to dissolve in Cu, diffuses further into Mo in the fourth layer, but the amount of Ti is so small so that it does not pass through the fourth layer. In a ceramic substrate having a multilayered metallic thin film thereon according to Example 1, thermal diffusion of Ti to the surface is prevented. This was affirmed by SIMS analysis in the depth direction.

EXAMPLE 21

A fine interconnection pattern was formed on an adequately washed alumina substrate 12 of 92% purity using the ECR-CVD apparatus shown in FIG. 3. An alumina substrate 12 by 2 inches square and 1 mm thick was placed on the sample stage 57, and the apparatus was evacuated to a high vacuum, while the alumina substrate 12 was heated to 500° C. When the temperature of the alumina substrate 12 in the apparatus became stable, Ar gas was introduced into the plasma generation chamber 51 from the supply system 51g, to generate an ECR plasma, the strength of the ECR magnetic field was 875 G and the microwave electricity was 500 W. Then, titanium tetrachloride (TiCl$_4$) gas was introduced into the sample chamber 53 from the reactive gas supply system 53g, the pressure inside the sample chamber 53 was set to be about 10$^{-2}$. The thickness of the Ti film formed after 5 minutes was found to be 0.5 μm.

Then, the steam of titanium tetrachloride (TiCl$_4$) was completely evacuated by introducing Ar gas, and after a plasma was generated in a manner similar to that used in the formation of Ti film, titanium tetrachloride (TiCl$_4$) gas and nitrogen gas were mixed and simultaneously introduced into the sample chamber 53 from the reactive gas supply system 53g, the pressure in the sample chamber 53 was set to be about 10$^{-2}$ Torr, after 3 minutes 0.2 μm thick and having an atomic ratio of Ti to N of 4:6 was formed.

When the temperature of the alumina substrate 12 became less than 100° C., the alumina substrate 12 was transferred to the holder in the magnetron sputtering apparatus directly connected to the ECR-CVD apparatus. The magnetron sputtering apparatus was evacuated to 1×10⁻⁶ Torr, Ar gas was introduced, the pressure was set to 5 mTorr and the substrate temperature was set to 120° C. Metallic thin films of Mo, Cu, Mo and Cu, 0.2 µm, 0.1 µm, 0.2 µm and 0.1 µm thick, respectively, were formed in that order on the TiNx film.

The alumina substrate 12 was taken out of the magnetron sputtering apparatus and irradiated at a temperature of less than 50° C., and a resist pattern 10 µm in film thickness was formed by photolithography. A coating of Cu, 6 µm thick, was formed in the grooved section of the resist pattern by electroplating, and the resist was peeled off. Wet etching was conducted on the multilayered thin film of the base, and the formation of all outer layer fine interconnection pattern was completed. The line width and space of the formed outer layer fine interconnection pattern were 100 µm and 60 µm respectively.

The film adhesion strength of the ceramic substrate having a multilayered metallic thin film formed thereon was measured as in the previous examples. In order to examine the diffusion of Ti to the surface of the Cu coating, the product was heated at 800° C. for 10 minutes and the density of Ti at the surface was measured by electron probe microanalysis (EPMA). The results of the film adhesion strength tests and EPMA analysis are shown in Table 5.

COMPARATIVE EXAMPLE 21

The same alumina substrate as was used in Example 21 was placed in the magnetron sputtering apparatus, which was evacuated to less than 1×10⁻⁶ Torr, while the substrate temperature was set to be 120° C. After the temperature of the alumina substrate became stable, Ar gas was introduced into the apparatus, and the pressure was set to be 5 mTorr. A multilayered metallic thin film consisting of metallic thin films of Ti, Mo, Cu, Mo and Cu in that order, 0.1 µm, 0.2 µm, 0.05 µm, 0.2 µm and 0.1 µm thick, respectively, was formed on the alumina substrate. After sputtering, as in Example 21, a resist pattern was formed, a coating of Cu 6 µm thick was formed in the grooved section of the resist pattern by electroplating, and wet etching was conducted on the multilayered metallic thin film of the base, and formation of an outer layer fine interconnection pattern was completed. The line width and space of the formed outer layer fine interconnection pattern were 100 µm and 50 µm respectively. The results of the film adhesion strength tests and EPMA analysis are shown in Table 5.

COMPARATIVE EXAMPLE 22

A multilayered metallic thin film consisting of metallic thin films of Ti, Mo and Cu in that order, 0.1 µm, 0.2 µm and 0.1 µm thick, respectively, was formed on the same alumina substrate as that used in Example 21 in a manner similar to that used in Comparative Example 21. After sputtering, in a manner similar to that of Example 21, a resist pattern was formed, a coating of Cu 6 µm thick was formed in the grooved section of the resist pattern by electroplating, wet etching was conducted on the multilayered metallic thin film of the base, and the formation of an outer layer fine interconnection pattern was completed. The line width and space of the formed outer layer fine interconnection pattern were 100 µm and 50 µm, respectively. The results of the film adhesion strength tests and EPMA analysis are shown in Table 5.

TABLE 5

| | film adhesion strength (kg/mm²) | measurement of diffusion of Ti to surface layer by EPMA |
|---|---|---|
| Example 21 | 4.8 | little Ti detected on surface |
| Comparative Example 21 | 2.5 | small amount of Ti detected on whole surface |
| Comparative Example 22 | 2.3 | diffusion of Ti along grain boundary to surface found |

As is apparent from Table 5, little Ti was detected in the outer layer of the ceramic substrate having a multilayered metallic thin film according to Example 21. Thus, by forming a TiNx film as the second thin film layer, the diffusion of Ti constituting the first metallic thin film layer to the coating layer was prevented, the decrease in thickness of the Ti film constituting the first layer was small and an adequate film adhesion strength of 4.8 kg/mm² was obtained. One reason for the high film adhesion strength was the improvement obtained by using a chemical vapor deposition method to form the Ti on the alumina substrate.

In the ceramic substrate having a multilayered metallic thin film thereon according to Comparative Example 21, a small amount of Ti was detected on the surface layer, which proves that thermal diffusion of titanium atoms to the surface occurred. And the film adhesion strength of 2.5 kg/mm² is much smaller, compared with that of 4.8 kg/mm² in Example 21.

In the ceramic substrate having a multilayered metallic thin film thereon according to Comparative Example 22, a considerable amount of Ti was detected along the grain boundary, which clearly proves that thermal diffusion of titanium atoms to the surface occurred. And the film adhesion strength of 2.3 kg/mm² is much smaller, compared with that of 4.8 kg/mm² in Example 21.

EXAMPLES 23–58 AND COMPARATIVES EXAMPLES 23–40

Figure 13:
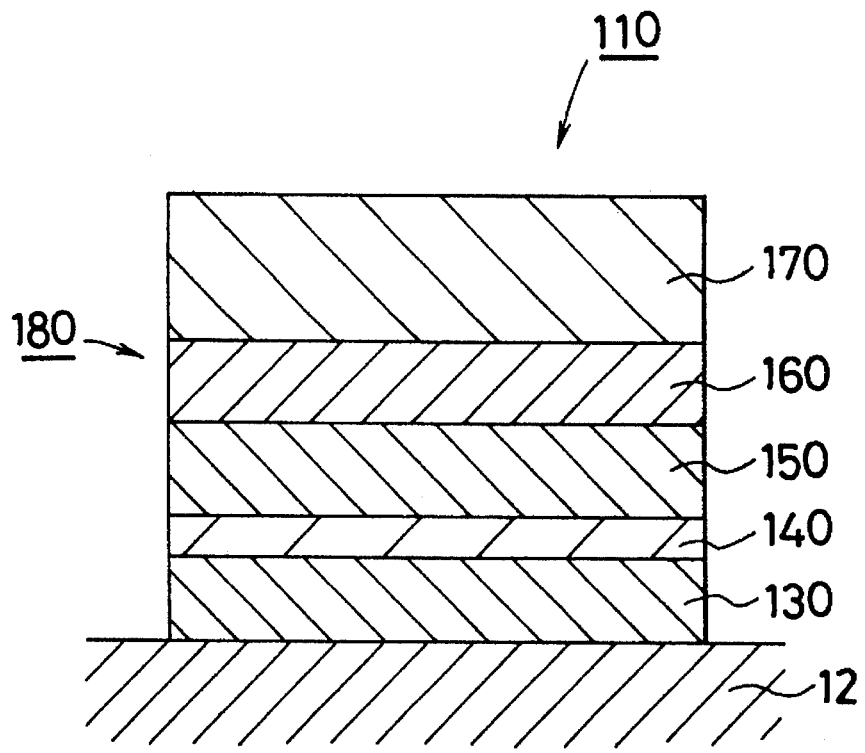
FIG. 13 is a diagrammatic sectional view showing the ceramic substrate having a multilayered metallic thin film according to still another embodiment of the present invention.
Figure 14:
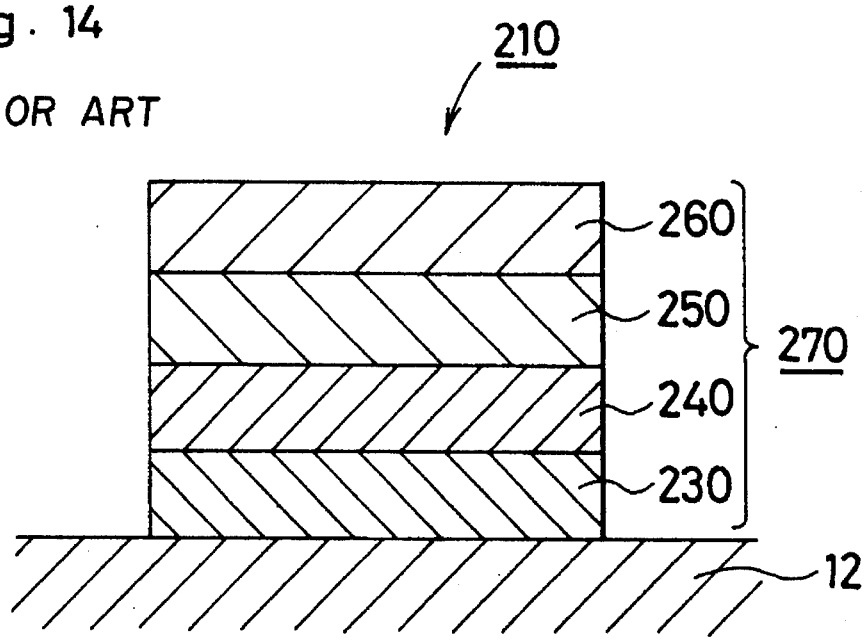
FIG. 14 is a diagrammatic sectional view showing the conventional ceramic substrate having a multilayered metallic thin film.
Figure 15:
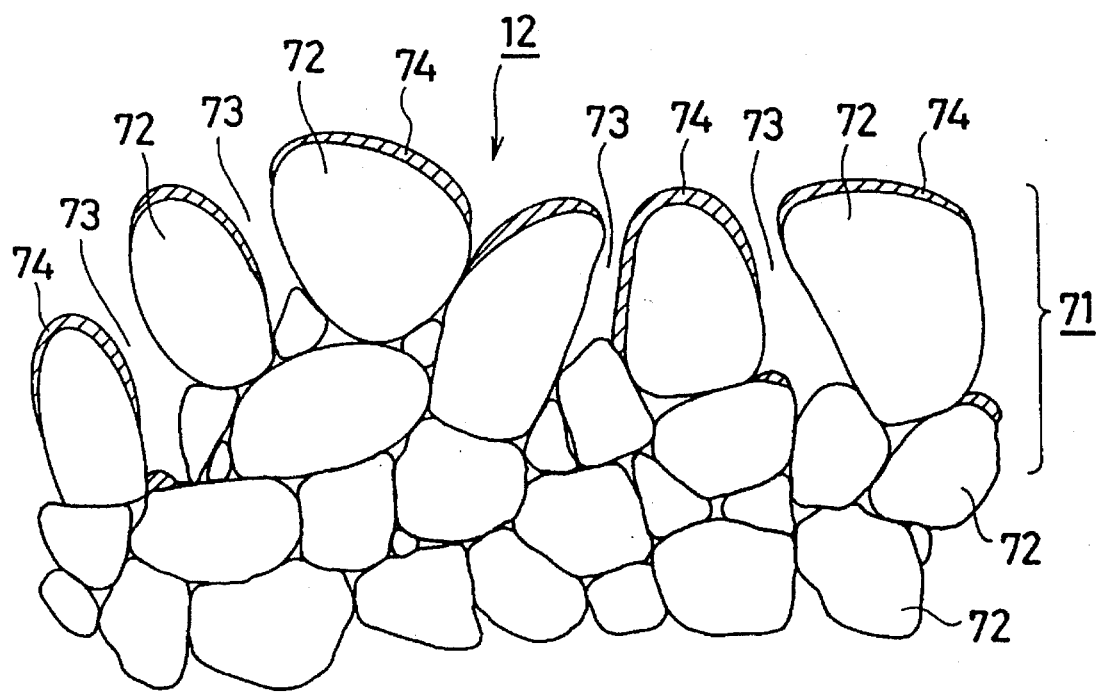
FIG. 15 is a diagrammatic sectional view showing the state of the outer layer section of the ceramic substrate when a metallic thin film was formed on its surface by a physical vapor deposition method.

FIG. 13 is a diagrammatic sectional view showing the structure of the ceramic substrates having a multilayered metallic thin film thereon according to the Examples. In the figure, reference numeral 12 represents a ceramic substrate comprising Al₂O₃, and the first metallic thin film layer 130 comprises Ti, Zr or Cr on the surface of the ceramic substrate 12, the second metallic thin film layer 140 comprises Fe or Fe—Ni alloy on the first metallic thin film layer 130, the third metallic thin film layer 150 comprises Ni or Mo on the second metallic thin film layer 140, the fourth metallic thin film layer 160 comprises Au, Ag, or Cu on the third metallic thin film layer 150 and a coating layer 170 comprises Au, Ag or Cu as the outermost layer on the fourth metallic thin film layer 160. The first metallic thin film layer 130, the second metallic thin film layer 140, the third metallic thin film layer 150, the fourth metallic thin film layer 160 and the coating layer 170 constitute a multilayered metallic thin film 180.

The ceramic substrate having a multilayered metallic thin film 180 thereon, designated by the number 110, is formed as follows: The first metallic thin film layer 130 having a thickness of 0.05–0.20 µm is formed by a chemical or physical vapor deposition method on the surface of the ceramic substrate 12 comprising Al₂O₃ using Ti, Zr or Cr which are very chemically active and which react readily with Al₂O₃.

The second metallic thin film layer 140 comprising Fe or Fe—Ni alloy and the third metallic thin film layer 150 comprising Ni or Mo are formed on the first metallic thin film layer 130 by a chemical or physical vapor deposition method. The thickness of the second metallic thin film layer 140 is set to be 0.01–0.05 μm and that of the third metallic thin film layer 150 is set to be 0.10–0.50 μm. The second metallic thin film layer 140 functions as a layer for strengthening the bonding which causes the first metallic thin film layer 130 and the third metallic thin film layer 150 to be connected tightly. The third metallic thin film layer 150 functions as a barrier for preventing the first metallic thin film layer 130 from oozing out to the fourth metallic thin film layer 160. The second metallic thin film layer 140 is preferably a thin layer about 0.01–0.5 μm. When it is thicker than that, rust is formed in a Fe containing laser and film adhesion strength is apt to be lowered.

The fourth metallic thin film layer 160 having a thickness of 0.10–0.30 μm is formed using Au, Ag or Cu having a small circuit resistance by a chemical or physical vapor deposition method on the third metallic thin film layer 150. Then, the coating layer 170 having a thickness of 3–4 μm for improving the circuit effect to make it possible to use the coated ceramic for a variety of purposes, is formed by chemical plating using the same group element as in IB the fourth metallic thin film layer 160.

The film thicknesses indicated above are the values preferred when forming a fine interconnection pattern for use in a package. Those thicknesses can be changed depending on the purposes for which composite 110 is to be used.

Tables 6–11 show the film adhesion strengths of the ceramic substrates having a multilayer metallic thin film according to the Examples and those consisting of the metallic thin films without the second metallic thin film layer 140 according to the Comparative Examples. The film adhesion strengths were measured by both a standard peel test and a peel test after heat cycling 200 times at temperatures between +150° C. and −60° C. for 30 minutes changing the temperature at the rate of 10° C./min.

TABLE 6

Data of film adhesion strength in the case of using Fe as intermediate thin film

| | ceramic substrate | metallic thin film | | | | | film adhesive strength (kg/mm$^2$) | |
| --- | --- | --- | --- | --- | --- | --- | --- | --- |
| | | first layer | second layer | third layer | fourth layer | outermost layer | usual | after heat cycle |
| Example 23 | Al$_2$O$_3$ | Ti | Fe | Ni | Au | Au | 4.2 | 4.2 |
| Example 24 | | Ti | | Mo | | | 3.5 | 3.5 |
| Example 25 | | Zr | | Ni | | | 5.4 | 5.5 |
| Example 26 | | Zr | | Mo | | | 3.4 | 3.6 |
| Example 27 | | Cr | | Ni | | | 4.3 | 4.2 |
| Example 28 | | Cr | | Mo | | | 3.2 | 3.0 |
| Comparative Example 23 | Al$_2$O$_3$ | Ti | — | Ni | Au | Au | 1.2 | 0.8 |
| Comparative Example 24 | | Ti | | Mo | | | 1.1 | 1.2 |
| Comparative Example 25 | | Zr | | Ni | | | 0.6 | 0.5 |
| Comparative Example 26 | | Zr | | Mo | | | 0.3 | 0.3 |
| Comparative Example 27 | | Cr | | Ni | | | 1.5 | 2.2 |
| Comparative Example 28 | | Cr | | Mo | | | 2.0 | 1.8 |

TABLE 7

Data of film adhesion strength in the case of using Fe as intermediate thin film

| | ceramic substrate | metallic thin film | | | | | film adhesive strength (kg/mm$^2$) | |
| --- | --- | --- | --- | --- | --- | --- | --- | --- |
| | | first layer | second layer | third layer | fourth layer | outermost layer | usual | after heat cycle |
| Example 29 | Al$_2$O$_3$ | Ti | Fe | Ni | Ag | Au | 3.5 | 3.2 |
| Example 30 | | Ti | | Mo | | | 3.7 | 3.5 |
| Example 31 | | Zr | | Ni | | | 3.8 | 3.7 |
| Example 32 | | Zr | | Mo | | | 2.8 | 2.6 |
| Example 33 | | Cr | | Ni | | | 4.0 | 4.2 |
| Example 34 | | Cr | | Mo | | | 3.8 | 3.6 |
| Comparative Example 29 | Al$_2$O$_3$ | Ti | — | Ni | Ag | Au | 2.3 | 0.8 |
| Comparative Example 30 | | Ti | | Mo | | | 1.8 | 1.8 |
| Comparative Example 31 | | Zr | | Ni | | | 0.5 | 0.5 |
| Comparative Example 32 | | Zr | | Mo | | | 0.6 | 0.9 |
| Comparative Example 33 | | Cr | | Ni | | | 2.3 | 1.2 |
| Comparative Example 34 | | Cr | | Mo | | | 2.6 | 0.8 |

TABLE 8

Data of film adhesion strength in the case of using Fe as intermediate thin film

| | ceramic substrate | metallic thin film | | | | | film adhesive strength (kg/mm$^2$) | |
| --- | --- | --- | --- | --- | --- | --- | --- | --- |
| | | first layer | second layer | third layer | fourth layer | outermost layer | usual | after heat cycle |
| Example 35 | Al$_2$O$_3$ | Ti | Fe | Ni | Cu | Cu | 2.9 | 2.6 |
| Example 36 | | Ti | | Mo | | | 3.7 | 3.5 |
| Example 37 | | Zr | | Ni | | | 3.8 | 3.7 |
| Example 38 | | Zr | | Mo | | | 2.2 | 2.0 |
| Example 39 | | Cr | | Ni | | | 3.2 | 3.2 |
| Example 40 | | Cr | | Mo | | | 3.4 | 3.5 |
| Comparative Example 35 | Al$_2$O$_3$ | Ti | — | Ni | Cu | Cu | 3.6 | 2.1 |
| Comparative Example 36 | | Ti | | Mo | | | 2.8 | 2.5 |
| Comparative Example 37 | | Zr | | Ni | | | 1.8 | 1.5 |
| Comparative Example 38 | | Zr | | Mo | | | 1.6 | 1.7 |
| Comparative Example 39 | | Cr | | Ni | | | 1.8 | 1.6 |
| Comparative Example 40 | | Cr | | Mo | | | 2.7 | 1.1 |

TABLE 9

Data of film adhesion strength in the case of using Fe as intermediate thin film

|  | ceramic substrate | metallic thin film | | | | | film adhesive strength (kg/mm$^2$) | |
|---|---|---|---|---|---|---|---|---|
|  |  | first layer | second layer | third layer | fourth layer | outermost layer | usual | after heat cycle |
| Example 41 | Al$_2$O$_3$ | Ti | Fe—Ni | Ni | Au | Au | 3.8 | 3.6 |
| Example 42 |  | Ti |  | Mo |  |  | 3.5 | 3.5 |
| Example 43 |  | Zr |  | Ni |  |  | 2.8 | 2.7 |
| Example 44 |  | Zr |  | Mo |  |  | 2.7 | 2.9 |
| Example 45 |  | Cr |  | Ni |  |  | 4.2 | 3.9 |
| Example 46 |  | Cr |  | Mo |  |  | 3.8 | 3.5 |
| Comparative Example 23 | Al$_2$O$_3$ | Ti | — | Ni | Au | Au | 1.2 | 0.8 |
| Comparative Example 24 |  | Ti |  | Mo |  |  | 1.1 | 1.2 |
| Comparative Example 25 |  | Zr |  | Ni |  |  | 0.6 | 0.5 |
| Comparative Example 26 |  | Zr |  | Mo |  |  | 0.3 | 0.3 |
| Comparative Example 27 |  | Cr |  | Ni |  |  | 1.5 | 2.2 |
| Comparative Example 28 |  | Cr |  | Mo |  |  | 2.0 | 1.8 |

TABLE 10

Data of film adhesion strength in the case of using Fe—Ni as intermediate thin film

|  | ceramic substrate | metallic thin film | | | | | film adhesive strength (kg/mm$^2$) | |
|---|---|---|---|---|---|---|---|---|
|  |  | first layer | second layer | third layer | fourth layer | outermost layer | usual | after heat cycle |
| Example 47 | Al$_2$O$_3$ | Ti | Fe—Ni | Ni | Ag | Au | 3.5 | 3.6 |
| Example 48 |  | Ti |  | Mo |  |  | 4.3 | 4.1 |
| Example 49 |  | Zr |  | Ni |  |  | 3.6 | 3.7 |
| Example 50 |  | Zr |  | Mo |  |  | 3.7 | 3.9 |
| Example 51 |  | Cr |  | Ni |  |  | 3.5 | 3.2 |
| Example 52 |  | Cr |  | Mo |  |  | 3.8 | 3.6 |
| Comparative Example 29 | Al$_2$O$_3$ | Ti | — | Ni | Ag | Au | 2.3 | 0.8 |
| Comparative Example 30 |  | Ti |  | Mo |  |  | 1.8 | 1.8 |
| Comparative Example 31 |  | Zr |  | Ni |  |  | 0.5 | 0.5 |
| Comparative Example 32 |  | Zr |  | Mo |  |  | 0.6 | 0.9 |
| Comparative Example 33 |  | Cr |  | Ni |  |  | 2.3 | 1.2 |
| Comparative Example 34 |  | Cr |  | Mo |  |  | 2.6 | 0.8 |

TABLE 11

Data of film adhesion strength in the case of using Fe—Ni as intermediate thin film

| | | metallic thin film | | | | film adhesive strength (kg/mm$^2$) | |
|---|---|---|---|---|---|---|---|
| | ceramic substrate | first layer | second layer | third layer | fourth layer | outermost layer | usual | after heat cycle |
| Example 53 | Al$_2$O$_3$ | Ti | Fe—Ni | Ni | Cu | Cu | 3.5 | 3.3 |
| Example 54 | | Ti | | Mo | | | 3.6 | 3.6 |
| Example 55 | | Zr | | Ni | | | 4.2 | 4.0 |
| Example 56 | | Zr | | Mo | | | 4.1 | 3.9 |
| Example 57 | | Cr | | Ni | | | 3.5 | 3.3 |
| Example 58 | | Cr | | Mo | | | 4.8 | 4.8 |
| Comparative Example 35 | Al$_2$O$_3$ | Ti | — | Ni | Cu | Cu | 3.6 | 2.1 |
| Comparative Example 36 | | Ti | | Mo | | | 2.8 | 2.5 |
| Comparative Example 37 | | Zr | | Ni | | | 1.8 | 1.5 |
| Comparative Example 38 | | Zr | | Mo | | | 1.6 | 1.7 |
| Comparative Example 39 | | Cr | | Ni | | | 1.8 | 1.6 |
| Comparative Example 40 | | Cr | | Mo | | | 2.7 | 1.1 |

As is apparent from Tables 6–11, some of Comparative Examples 23–40 had a film adhesion strength of more than 3 kg/mm$^2$, but after thermal shock their film adhesion strengths were considerably deteriorated and did not remain at more than 3 kg/mm$^2$. The substrates in Examples 23–58 had a stable strength even after thermal shock, and most of them had a film strength of more than 3 kg/mm$^2$ even after thermal shock. Thus, in the ceramic substrate having a multilayered metallic thin film 110 thereon according to the Examples, the bonding strength between the first metallic thin film layer 130 and the third metallic thin film layer 150 is not lowered, even at high temperatures, because of the existence of the second metallic thin film layer 140, and even after thermal shock, the film adhesion strength as a whole is not deteriorated.

As described above in detail, in the ceramic substrate having a multilayered metallic thin film thereon according to the present invention, wherein plural metallic thin film layers are formed on the ceramic substrate, the first metallic thin film layer comprising one or more elements selected from Ti, Zr, Cr and W, the second metallic thin film layer comprising Fe or an alloy containing Fe, the third metallic thin film layer comprising one or more elements selected from Ni and Mo, and the fourth metallic thin film layer comprising one or more elements selected from Cu, Ag and Au, are formed in turn on the ceramic substrate, the ceramic substrate and the multilayered metallic thin film, and every metallic thin film layer in the multilayered metallic thin film are tightly bonded. As a result, a ceramic substrate having a multilayered metallic thin film thereon having a high film adhesion strength, which is not deteriorated by thermal shock, is obtained.

What is claimed is:

1. A ceramic substrate having a five-layered metallic film thereon, wherein:

the first layer on the ceramic substrate has a thickness of 0.05–0.20 μm and comprises at least one metal selected from the group consisting of Ti, Zr, Cr and W;

the second layer has a thickness of 0.10–0.20 μm and comprises at least one metal selected from the group consisting of Ni and Mo;

the third layer has a thickness of 0.01–0.02 μm and comprises at least one metal selected from the group consisting of the elements of group Ib in the periodic table;

the fourth layer has a thickness of 0.01–0.30 μm and comprises the same metals as the second layer; and the fifth layer has a thickness of 0.20–0.50 μm and comprises the same metals as the third layer.

2. A ceramic substrate having a five-layered metallic film thereon according to claim 1, wherein the ceramic substrate is an alumina substrate.

* * * * *